United States Patent
Imai et al.

(10) Patent No.: US 9,099,598 B2
(45) Date of Patent: Aug. 4, 2015

(54) LIGHT-EMITTING DEVICE AND METHOD FOR MANUFACTURING LIGHT-EMITTING DEVICE

(71) Applicant: SHOWA DENKO K.K., Minato-ku, Tokyo (JP)

(72) Inventors: Naoyuki Imai, Tokyo (JP); Takashi Terashima, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/357,042

(22) PCT Filed: Nov. 2, 2012

(86) PCT No.: PCT/JP2012/078489
§ 371 (c)(1),
(2) Date: May 8, 2014

(87) PCT Pub. No.: WO2013/069570
PCT Pub. Date: May 16, 2013

(65) Prior Publication Data
US 2015/0162494 A1 Jun. 11, 2015

(30) Foreign Application Priority Data
Nov. 9, 2011 (JP) ................................ 2011-245831

(51) Int. Cl.
*H01L 33/22* (2010.01)
*H01L 33/08* (2010.01)
(Continued)

(52) U.S. Cl.
CPC .............. *H01L 33/08* (2013.01); *H01L 33/005* (2013.01); *H01L 33/24* (2013.01); *H01L 33/44* (2013.01); *H01L 33/62* (2013.01); *H01L 2933/0025* (2013.01)

(58) Field of Classification Search
CPC ....... H01L 33/08; H01L 33/005; H01L 33/24; H01L 33/44; H01L 33/62; H01L 27/32; H01L 27/3211; H01L 27/3246; H01L 51/5096

USPC ............................................... 257/99; 438/22
See application file for complete search history.

(56) References Cited

U.S. PATENT DOCUMENTS

| 6,414,104 B1 | 7/2002 | Pei |
| 6,593,687 B1 | 7/2003 | Pei et al. |

(Continued)

FOREIGN PATENT DOCUMENTS

| JP | 2003-522371 A | 7/2003 |
| JP | 2006-003870 A | 1/2006 |

(Continued)

OTHER PUBLICATIONS

Yutaka Ohmori, Recent Development of Highly Efficient Organic EL Materials, Oyo Butsuri, Dec. 2001, pp. 1419-1425, Vo. 70, No. 12.
(Continued)

*Primary Examiner* — Peter Bradford
(74) *Attorney, Agent, or Firm* — Sughrue Mion, PLLC

(57) ABSTRACT

A light-emitting device (10) is provided with: a substrate (11); a light-emitting region including a light-emitting portion (17) formed to contact a first electrode layer (12) and a second electrode layer (14); and plural concave portions (16). The light-emitting portion contacting at least the first electrode layer and the dielectric layer in the concave portion. The light-emitting device further comprises a terminal (anode terminal) (15) formed outside the light-emitting region, and connecting one of the first electrode layer (12) and the second electrode layer (14) having larger sheet resistance to a power supply. In the light-emitting region, the plural concave portions (16) are formed such that the sum, per unit area, of a contour length of the planar shapes of the concave portions (16) on an upper face of the dielectric layer (13) increases from a region near the terminal (15) towards a region far from the terminal (15).

9 Claims, 12 Drawing Sheets

(51) Int. Cl.
*H01L 33/00* (2010.01)
*H01L 33/24* (2010.01)
*H01L 33/44* (2010.01)
*H01L 33/62* (2010.01)

(56) References Cited

U.S. PATENT DOCUMENTS

| | | |
|---|---|---|
| 2001/0053843 A1 | 12/2001 | Pei |
| 2005/0212841 A1* | 9/2005 | Okano .............................. 347/13 |
| 2005/0260335 A1 | 11/2005 | Kimura et al. |
| 2007/0052119 A1 | 3/2007 | Sakai et al. |
| 2007/0210700 A1 | 9/2007 | Kato et al. |
| 2007/0228368 A1* | 10/2007 | Takahashi et al. .............. 257/40 |
| 2008/0217648 A1 | 9/2008 | Ohara |
| 2010/0219424 A1* | 9/2010 | Yoshida et al. .................. 257/88 |
| 2012/0267614 A1 | 10/2012 | Tajima et al. |
| 2014/0061711 A1* | 3/2014 | Yokoyama ....................... 257/99 |

FOREIGN PATENT DOCUMENTS

| | | |
|---|---|---|
| JP | 2007-029441 A | 2/2007 |
| JP | 2007-080602 A | 3/2007 |
| JP | 2007-080603 A | 3/2007 |
| JP | 2007-103349 A | 4/2007 |
| JP | 2008-243396 A | 10/2008 |
| JP | 2008-251531 A | 10/2008 |
| WO | 01/05863 A1 | 1/2001 |
| WO | 01/06577 A1 | 1/2001 |
| WO | 2005/034586 A1 | 4/2005 |
| WO | 2008/108254 A1 | 9/2008 |
| WO | 2010/016512 A1 | 2/2010 |
| WO | 2010/032757 A1 | 3/2010 |
| WO | 2010/032758 A1 | 3/2010 |
| WO | 2011/010503 A1 | 1/2011 |

OTHER PUBLICATIONS

International Search Report for PCT/JP2012/078489 dated Dec. 4, 2012.

* cited by examiner

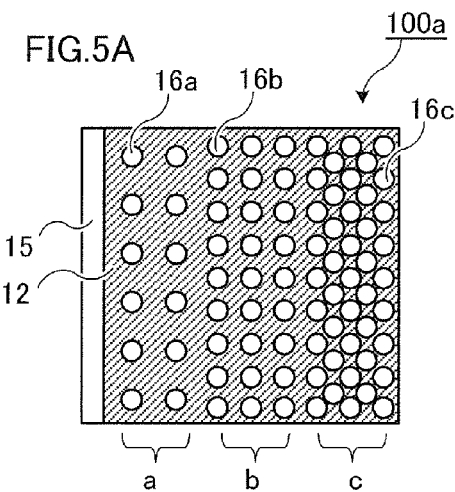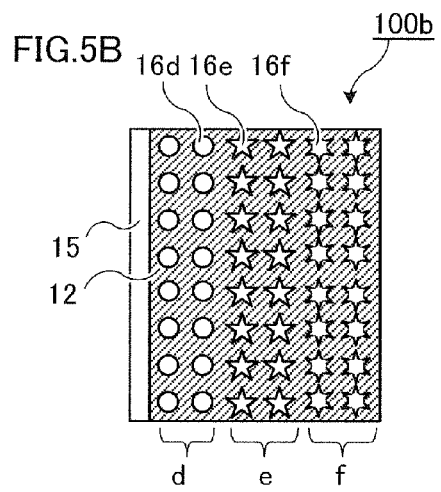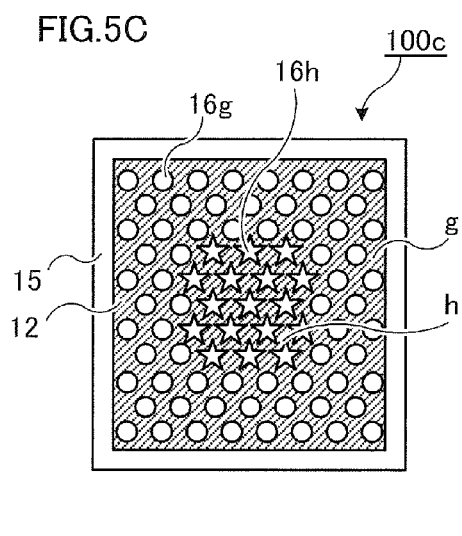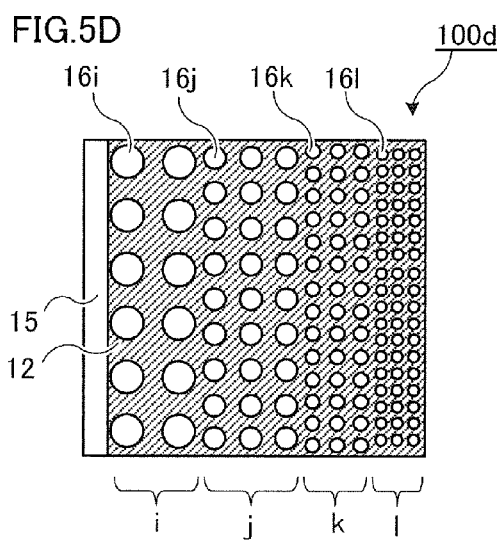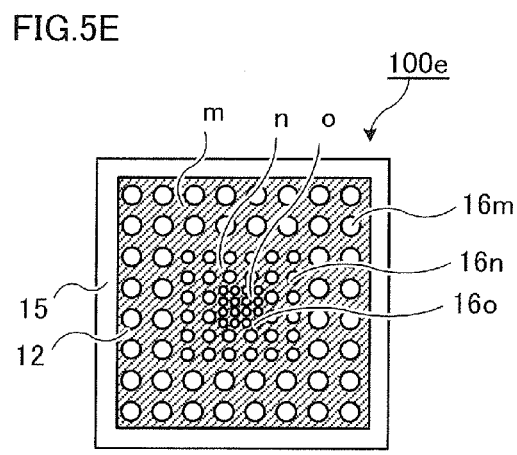

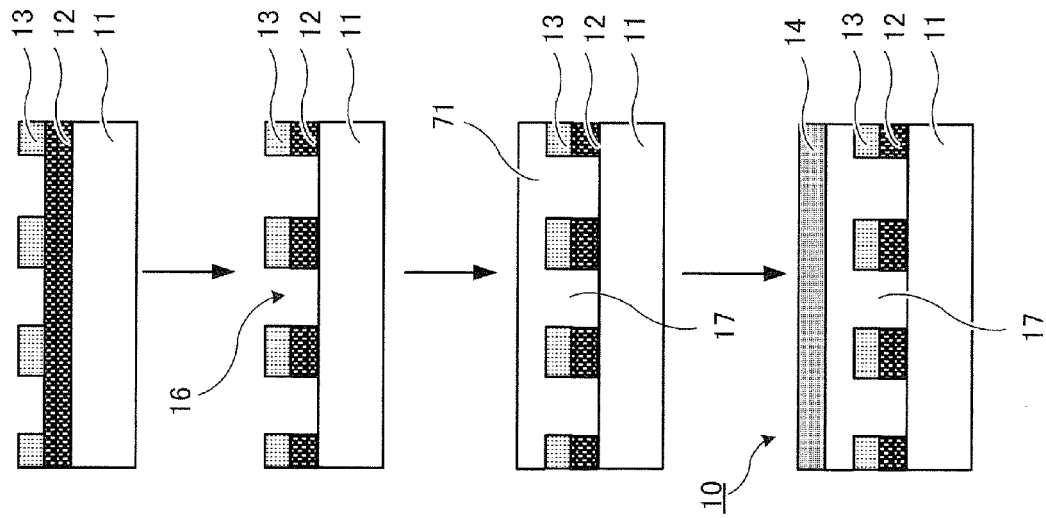
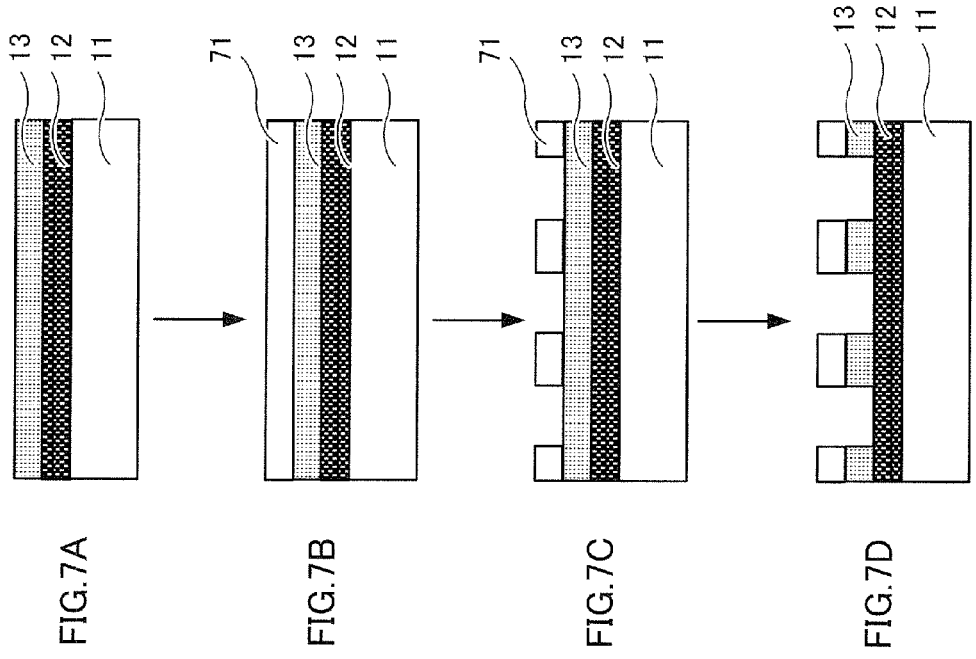

LIGHT-EMITTING DEVICE AND METHOD FOR MANUFACTURING LIGHT-EMITTING DEVICE

CROSS REFERENCE TO RELATED APPLICATIONS

This application is a National Stage of International Application No. PCT/JP2012/078489 filed Nov. 2, 2012, claiming priority based on Japanese Patent Application No. 2011-245831, filed Nov. 9, 2011, the contents of all of which are incorporated herein by reference in their entirety.

TECHNICAL FIELD

The present invention relates to a light-emitting device and a method of manufacturing a light-emitting device, in detail, relates to a light-emitting device and the like having high brightness uniformity and using an electroluminescent element with a configuration in which a light-emitting layer including a light-emitting material is sandwiched with a pair of electrodes.

BACKGROUND ART

An electroluminescent element has a configuration in which a light-emitting layer including a light-emitting material is sandwiched between an anode electrode and a cathode electrode, and is provided with a characteristics that a light-emission with high brightness is available with a low driving voltage. Therefore, the electroluminescent element is expected to be applied to an electro-optical device such as a display or an illumination.

In recent years, for a purpose of improving a performance as an illumination usage, researches have been conducted on improving a light extraction efficiency or making a light-emitting surface larger in area size. For example, in Patent Document 1, it is disclosed that the light extraction efficiency is improved with a light-emitting element in which a dielectric layer is formed between an anode electrode layer and a cathode electrode layer, a cavity (a concave portion) extends through at least one of the dielectric layer and the electrode layers and an inside surface of the cavity is covered with an electroluminescence coating material. Here, when numeral cavities are arranged inside of electrode surfaces and a size of each cavity and a gap between cavities are small enough, the light emission is visible as a surface light emission.

In an electroluminescent element, in general, a transparent electrode such as indium tin oxide (ITO) is used for one of the anode electrode and the cathode electrode in order to gain a high light-emitting efficiency, while a light-reflecting electrode such as a metal or the like is used for the other. A sheet resistance of ITO is higher compared to that of a metal. Therefore, between a portion near a terminal of the ITO electrode and a portion far from the terminal in the light-emitting surface, the voltage between the anode electrode and the cathode electrode comes to be different due to a voltage drop. Accordingly, when the light-emitting area is made large, a brightness distribution in the light-emitting surface becomes non-uniform.

To address such a problem, in Patent Documents 2 and 3, electroluminescent elements are disclosed in which a non-light-emitting portion is provided in a light-emitting surface with a method of arranging an insulating material between the electrodes or the like so that an area rate of the non-light-emitting portion is made smaller as a distance from a terminal of the electrode gets farther. Namely, by making an area of a substantial light-emitting portion larger at a region far from the terminal of the electrode, a brightness distribution in the light-emitting surface becomes uniform.

CITATION LIST

Patent Literature

Patent Document 1: Japanese Patent Application Unexamined Publication (Translation of PCT Application) No. 2003-522371
Patent Document 2: Japanese Patent Application Laid-Open Publication No. 2007-294441
Patent Document 3: International Publication of Patent Application No. 2005/034586

DISCLOSURE OF INVENTION

Technical Problem

In the case of the electroluminescent element described in Patent Document 1, when the cavities having the same size are arranged with a constant gap, the voltage drop occurs due to an electrical resistance of the electrodes, thereby the brightness distribution in the light-emitting surface tends to be non-uniform. Further, as in the case of the electroluminescent elements described in Patent Documents 2 and 3, making a size of a cavity, which is provided at a position far from the terminal of the electrode, larger compared to a cavity provided near the terminal may cause a brightness distribution in the light-emitting surface to be more non-uniform in some cases.

The problem to be addressed of the present invention is to provide a light-emitting device in which a brightness distribution in the light-emitting surface is uniform and a light extraction efficiency is high in an electroluminescent element including plural cavities.

Solution to Problem

The present inventors have identified the cause of the above problem that, in the light-emitting device having plural cavities, a light-emitting brightness distribution in each of the cavities is non-uniform, and addressed the problem with a solution shown below.

According to the present invention, a light-emitting device is provided, the light-emitting device including, a substrate, a first electrode layer that is formed on the substrate, a dielectric layer that is formed directly on the first electrode layer or formed on the first electrode layer with another layer interposed therebetween, a second electrode layer that is formed directly on the dielectric layer or on the dielectric layer with another layer interposed therebetween, and a light-emitting portion that contacts the first electrode layer and the second electrode layer wherein, plural concave portions are formed to pass through the dielectric layer and at least one of the first electrode layer and the second electrode layer, the light-emitting portion is formed to contact at least the first electrode layer and the dielectric layer in the concave portion, and a light-emitting region is set to include the first electrode layer, the dielectric layer, the second electrode layer and the light-emitting portion and to include all the plural concave portions as seen from a direction perpendicular to the substrate plane, and the light-emitting device further includes a terminal that is formed outside of the light-emitting region and connects one of the first electrode layer and the second electrode layer having larger sheet resistance to a power supply, wherein, in the light-emitting region, the plural concave portions are formed so that a sum, per unit area, of a contour length of planar shapes of the concave portions on an upper surface of the dielectric layer is increased from a region near the terminal to a region far from the terminal, is provided.

In the present invention, it is preferable that in the light-emitting region, all of the planar shapes of the plural concave portions at the upper surface of the dielectric layer are the same.

In the light-emitting region, it is preferable that the planar shapes of the plural concave portions at the upper surface of the dielectric layer are similar to each other.

In the light-emitting region, it is preferable that the planar shapes of the plural concave portions at the upper surface of the dielectric layer include at least two shapes that are not similar to each other.

In the light-emitting region, it is preferable that an area occupation ratio of the planar shape of the plural concave portions at the upper surface of the dielectric layer is substantially the same in an arbitrary region in the light-emitting region.

In the present invention, it is preferable that the light-emitting region has plural sub-regions divided in accordance with a distance from the terminal, a distribution pattern of the concave portions formed in the sub-region nearest the terminal is regarded as a basic pattern, a distribution pattern of the concave portions in another sub-region is a reduced pattern of the basic pattern; and a reduction ratio of the reduced pattern of the another sub-region with respect to the basic pattern decreases as the another sub-region is far from the terminal.

In the light-emitting region, it is preferable that the maximum width of each of the concave portions at an upper surface of the dielectric layer is 10 μm or less.

In the light-emitting region, it is preferable that the concave portions are formed $10^2$ to $10^8$ per 1 mm square.

Further, according to the present invention, a method of manufacturing a light-emitting device is provided, the method including, a first electrode layer forming process in which a first electrode layer and a dielectric layer are formed on a substrate in order, a concave portion forming process in which, by a photolithography which includes an exposure of the photoresist layer formed on the dielectric layer by use of a photomask of a predetermined pattern, plural concave portions that pass through the first electrode layer and the dielectric layer are formed, a light-emitting portion forming process in which a light-emitting portion is formed so as to fill at least a part of each of the concave portions and to cover surfaces of the first electrode layer and the dielectric layer that are exposed in each of the concave portions, a second electrode layer forming process in which a second electrode layer is formed on the light-emitting portion, a terminal forming process in which, of the first electrode layer and the second electrode layer, a terminal that connects the electrode layer having larger sheet resistance to a power supply is formed; wherein, in the concave portion forming process, a surface of the photoresist layers is divided into plural sub-regions in accordance with a distance from the terminal, the photomask pattern corresponding to a distribution pattern of the concave portions that are formed nearest the terminal is regarded as a basic pattern, the photomask pattern corresponding to a distribution pattern of the concave portions in another sub-region is a reduced pattern of the basic pattern, and a reduction ratio of the reduced pattern of the another sub-region with respect to the basic pattern is decreased as the another sub-region is far from the terminal is provided.

Advantageous Effects of Invention

According to the present invention, a light-emitting device using an electroluminescent element which has a high luminous efficiency, has a uniform brightness distribution in the light-emitting area and is easy to be manufactured is provided.

BRIEF DESCRIPTION OF DRAWINGS

FIGS. 5A to 5E are diagrams for illustrating specific examples of a distribution state of the concave portions in the light-emitting device;

FIGS. 7A to 7H are diagrams for illustrating a specific example of a method of manufacturing the light-emitting device to which the present exemplary embodiment is applied;

DESCRIPTION OF EMBODIMENTS

Hereinbelow, an exemplary embodiment according to the present invention will be described in detail. It should be noted that the present invention is not limited to the following exemplary embodiment, but may be practiced as various modifications within the scope of the gist of the invention. Further, each of the figures to be used indicates a specific example for illustration of the exemplary embodiment, and does not represent an actual size thereof.

First Exemplary Embodiment

Figure 1:
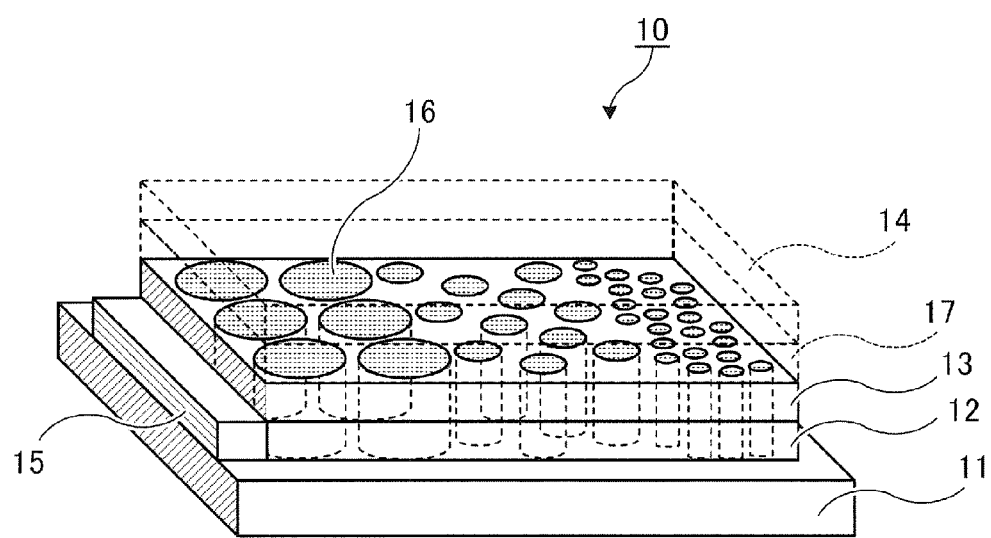
FIG. 1 is a diagram for illustrating the first exemplary embodiment of a light-emitting device in the present exemplary embodiment.
Figure 2:
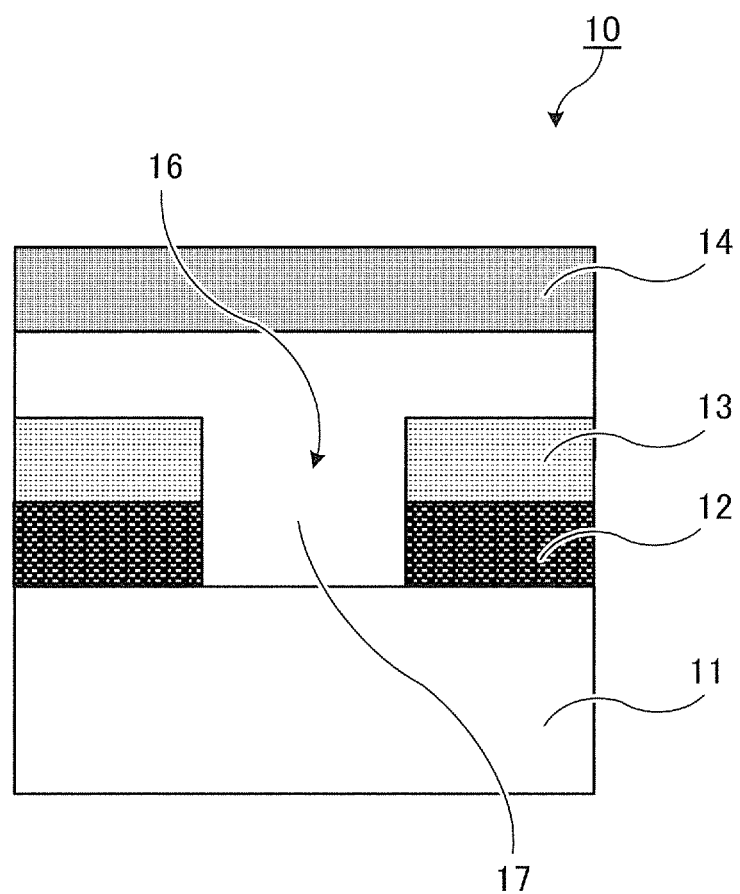
FIG. 2 is a partial cross-sectional view for illustrating a specific example of the light-emitting device shown in FIG. 1.

FIG. 1 is a diagram for illustrating the first exemplary embodiment of a light-emitting device 10 in the present exemplary embodiment. FIG. 2 is a partial cross-sectional view for illustrating a specific example of the light-emitting device 10 shown in FIG. 1. Hereinafter, the light-emitting device 10 will be explained with reference to FIGS. 1 and 2.
<Light-Emitting Device 10>
In the light-emitting device 10, a substrate 11, an anode layer 12 as a first electrode layer for injecting holes, which is formed on the substrate 11 in the case where the substrate 11 side is assumed to be the downside, and a dielectric layer 13 that is formed on the anode layer 12 and has an insulating property are stacked in order. Moreover, a concave portion 16 that passes through the anode layer 12 and the dielectric layer 13 is formed. Further, a light-emitting portion 17 that is formed successively from an upper surface of the dielectric layer 13 to an inner surface of the concave portion 16 and includes a light-emitting layer emitting light with application of voltage is provided.

In the present exemplary embodiment, a configuration is employed in which a cathode layer 14 as a second electrode layer for injecting electrons is stacked at an upper part of the light-emitting portion 17. A light-emitting region of the light-emitting device 10 is a region that includes a configuration of the above-described anode layer 12, the dielectric layer 13, the light-emitting portion 17 and the cathode layer 14 and includes all the plural concave portions 16 as seen from the upper direction of the light-emitting device 10 (the direction perpendicular to the plane of the substrate 11). Moreover, at an outside of the light-emitting region on the substrate 11, an anode electrode terminal 15 as a terminal that is electrically connected to the anode layer 12 and connects the anode layer 12 with a power supply (not shown in the figure) is formed. It should be noted that the cathode layer 14 is illustrated with a dotted line in FIG. 1.

As shown in FIG. 1, in the light-emitting device 10 to which the present exemplary embodiment is applied, the plural concave portions 16 that include the light-emitting portion 17 inside thereof are scattered. Then, the plural concave portions 16 are formed in such a manner that, a sum, per unit area, of a contour length of planar shapes of the concave portion 16 viewed from a direction perpendicular to the substrate 11 is increased successively or gradually from a region near the anode electrode terminal 15 to a region far from the terminal 15.

Next, other exemplary embodiments of partial cross-sectional shapes of the light-emitting device 10 will be described. Same symbols are assigned to configurations same as those in FIGS. 1 and 2, and description thereof will be omitted.

FIGS. 3A to 3D are diagrams for illustrating other exemplary embodiments of partial cross-sectional shapes of the light-emitting device 10.

Figure 3A:
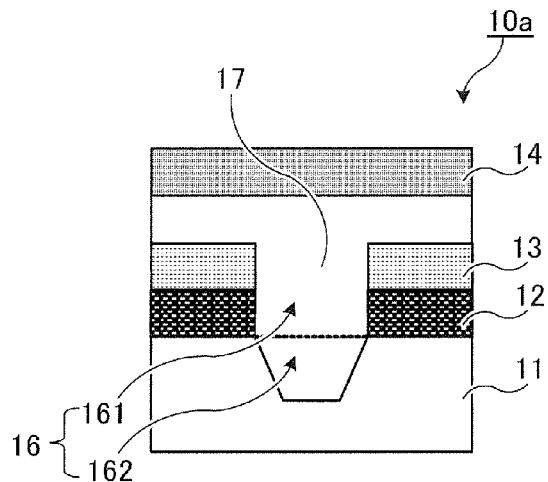
FIGS. 3A to 3D are diagrams for illustrating other exemplary embodiments of partial cross-sectional shapes of the light-emitting device.

In a partial cross-sectional shape 10a shown in FIG. 3A, the concave portion 16 is configured with; a passing-through portion 161 that passes through the anode layer 12 and the dielectric layer 13; and a bored portion 162 that is connected to the passing-through portion 161 and is formed by removing a part of the substrate 11 with etching or the like. By providing the bored portion 162, among the light emitted from the light-emitting portion 17 and forwarded to a direction of the substrate 11, light to be extracted without total reflection is increased.

Figure 3B:
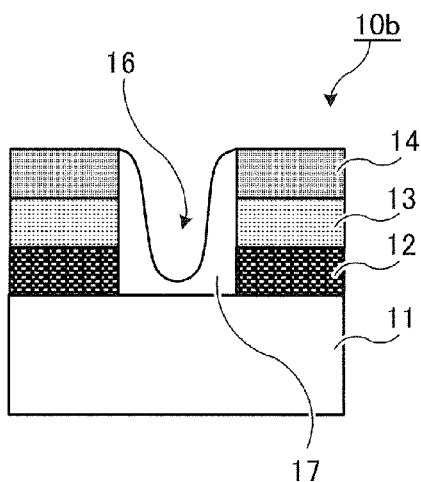

In a partial cross-sectional shape 10b shown in FIG. 3B, the concave portion 16 is formed to pass through the anode layer 12, the dielectric layer 13 and the cathode layer 14. Here, the light-emitting portion 17 is formed so that a light-emitting material to be described later is filled in a part of the concave portion 16 and the light-emitting portion 17 cover surfaces of the anode layer 12, the dielectric layer 13 and the cathode layer 14 and an upper surface of the substrate 11 which configure an inner surface of the concave portion 16. By forming the concave portion 16 to pass through the cathode layer 14, even in the case where the cathode layer 14 is formed with an opaque material, light can be extracted not only from a substrate 11 side but from a cathode layer 14 side.

Figure 3C:
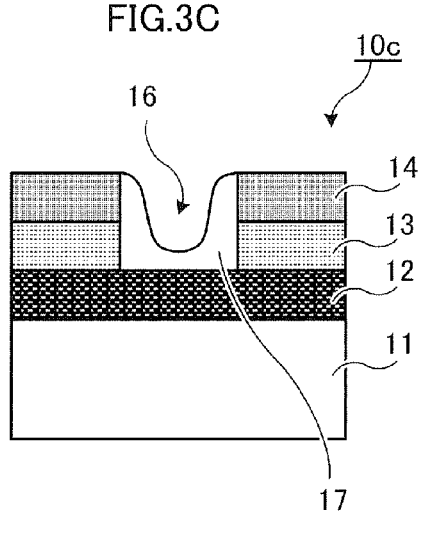

In a partial cross-sectional shape 10c shown in FIG. 3C, the concave portion 16 is formed to pass through the dielectric layer 13 and the cathode layer 14. The concave portion 16 is not provided in the anode layer 12. The light-emitting portion 17 is formed so that a light-emitting material to be described later is filled in a part of the concave portion 16 and the light-emitting portion 17 cover surfaces of the dielectric layer 13 and the cathode layer 14 and an upper surface of the anode layer 12 which configure the inner surface of the concave portion 16. When the light-emitting device 10 is provided with the partial cross-sectional shape 10c, similarly to the case of the partial cross-sectional shape 10b shown in FIG. 3B, light can be extracted not only from the substrate 11 side but from the cathode layer 14 side.

Figure 3D:
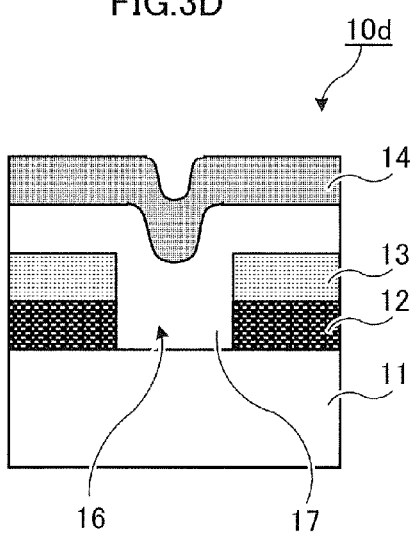

In a partial cross-sectional shape 10d shown in FIG. 3D, similarly to the case of the partial cross-sectional shape of the light-emitting device 10 shown in FIG. 2, the concave portion 16 is formed to pass through the anode layer 12 and the dielectric layer 13. Here, the light-emitting portion 17 is formed so that a light-emitting material to be described later is filled in the concave portion 16 and the light-emitting portion 17 cover an upper surface of the dielectric layer 13. At an upper surface of a portion of the light-emitting portion 17 corresponding to the concave portion 16, a dent is formed so that a surface of the light-emitting portion 17 is dented toward the substrate 11 side. Further, also in the cathode layer 14 that is formed on the light-emitting portion 17, a dent is formed at an upper surface of a portion corresponding to the concave portion 16 to follow the surface shape of the light-emitting portion 17.

(Substrate 11)

The substrate 11 is a base material that serves as a support body for forming the anode layer 12, the dielectric layer 13, the cathode layer 14 and the light-emitting portion 17. For the substrate 11, a material that satisfies mechanical strength required for the light-emitting device 10 is used.

The material for the substrate 11 is, in the case where the light is to be extracted from the substrate 11 side of the light-emitting device 10, required to be transparent to the visible light. It should be noted that, in the present exemplary embodiment, "transparent to the visible light" means that the visible light emitted from the light-emitting portion 17 with a constant wavelength range can be transmitted, therefore, it is not necessary to be transparent at a whole region of the visible light. However, in the present exemplary embodiment, it is preferable that the substrate 11 is transmitted by the light in the wavelength range of 450 nm to 700 nm as the visible light. Moreover, in a wavelength with a maximum light-emitting intensity, the transmittance is preferably 50% or more, and more preferably 70% or more.

As the material for such a transparent substrate 11 to satisfy the requirements, specific examples include: glasses such as sapphire glass, soda glass and quartz glass and the like; transparent resins such as acrylic resins, methacrylic resins, polycarbonate resins, polyester resins, nylon resins and the like, silicon; metallic nitride such as aluminum nitride and the like; and transparent metallic oxide such as alumina and the like. In the case of using, as the substrate 11, a resin film or the like made of the aforementioned transparent resins, it is preferable that permeability to gas such as moisture and oxygen is low. In the case of using a resin film or the like having high permeability to gas, a thin film having a barrier property for inhibiting permeation of gas is preferably formed within a scope which does not impair the light transmission.

In the case where it is not necessary to extract the light from the substrate 11 side of the light-emitting device 10, the material for the substrate 11 is not limited to the ones which are transparent to the visible light, and may be opaque to the visible light. Specific examples of the material of the substrate 11 include: in addition to the above-described materials, simple substances such as copper (Cu), silver (Ag), gold (Au), platinum (Pt), tungsten (W), titanium (Ti), tantalum (Ta) and niobium (Nb); alloys thereof; stainless steel or the like. The thickness of the substrate 11 depends on the required mechanical strength, is arbitrarily selected and not particularly limited. In the present exemplary embodiment, the thickness of the substrate 11 is preferably 0.1 mm to 10 mm, and more preferably 0.25 mm to 2 mm.

(Anode layer 12)

The anode layer 12 injects holes from the anode layer 12 to the light-emitting portion 17 upon application of voltage between the anode layer 12 and the cathode layer 14. A material used for the anode layer 12 is not particularly limited as long as it has an electric conductivity. It is preferable that the material has a large work function, and specifically, the work function is preferably not less than 4.5 eV. In addition, it is preferable that the electric resistance is not notably changed for an alkaline aqueous solution. As the material satisfying such requirements, metal oxides, metals or alloys can be used.

In the light-emitting device 10 of the present exemplary embodiment, the concave portion 16 is formed to pass through the anode layer 12 and the dielectric layer 13. Therefore, since the light emitted from the light-emitting portion 17 can be extracted from the substrate 11 side through the concave portion 16, the material used for the anode layer 12 may be transparent one or opaque one.

As a transparent material used for forming the transparent electrode, for example, specific example includes: indium oxide, zinc oxide, tin oxide, indium tin oxide (ITO) and indium zinc oxide (IZO) which are complexes thereof, or the like. Among these materials, ITO, IZO and tin oxide are preferable. Moreover, a transparent conductive film composed of organic substances such as polyaniline or a derivative thereof and polythiophene or a derivative thereof.

As a transparent material used for forming the opaque electrode, for example, specific example includes: copper (Cu), silver (Ag), gold (Au), platinum (Pt), aluminum (Al), tungsten (W), titanium (Ti), tantalum (Ta) and niobium (Nb) or the like. Further, alloys thereof and stainless steel or the like may be used.

The thickness of the anode layer 12 is, in the case of using the opaque electrode, preferably 2 nm to 2 mm, and more preferably 2 nm to 2 µm, and in the case of using the transparent electrode, preferably 2 nm to 300 nm since high light transmission is required. Note that, the work function can be measured by, for example, an ultraviolet photoelectron spectroscopy.

In the present exemplary embodiment, from a viewpoint of facilitating the injection of holes from the anode layer 12 to the light-emitting portion 17, as an anode surface modification layer, a layer with a thickness of 1 nm to 200 nm composed of molybdenum (MO) oxide, amorphous carbon and carbon fluoride or the like or a layer with an average thickness of not more than 10 nm composed of metal oxide, metal fluoride or the like may be provided at a surface on a side of the anode layer 12 that contacts with the light-emitting portion 17.

(Dielectric Layer 13)

The dielectric layer 13 is provided between the anode layer 12 and the cathode layer 14 to separate and insulate the anode layer 12 and the cathode layer 14 with a predetermined gap therebetween and to form the concave portion 16 where the light-emitting portion 17 contacts the anode layer 12 inside thereof. Thus, it is necessary for the dielectric layer 13 to be made of a material having high resistivity. The electric resistivity thereof is required to be not less than $10^8$ Ωcm, and preferably not less than $10^{12}$ Ωcm.

Specific examples of the material for forming the dielectric layer 13 include: silicon nitride, boron nitride and metal nitride such as aluminum nitride; silicon oxide (silicon dioxide) and metal oxide such as aluminum oxide. In addition, polymer compounds such as polyimide, polyvinylidene fluoride and parylene can be used.

The thickness of the dielectric layer 13 is preferably not more than 1 µm in order that the entire thickness of the light-emitting device 10 may not become too thick. In the present exemplary embodiment, thickness of the dielectric layer 13 is preferably 10 nm to 500 nm, more preferably 50 nm to 200 nm. Since the voltage necessary to emit light is lower as the space between the anode layer 12 and the cathode layer 14 is narrower, the dielectric layer 13 is preferably thinner from this viewpoint. However, if the dielectric layer 13 is too thin, dielectric strength becomes possibly insufficient against the voltage for driving the light-emitting device 10.

(Cathode Layer 14)

The cathode layer 14 injects electrons into the light-emitting portion 17 upon application of voltage between the anode layer 12 and the cathode layer 14. In the exemplary embodiment, since the concave portion 16 is filled with the light-emitting portion 17 as will be described later, the cathode layer 14 is formed above the dielectric layer 13 as a successive film that is not passed through by the concave portion 16.

The material used for the cathode layer 14 is not particularly limited as long as, similarly to that of the anode layer 12, the material has electrical conductivity. In the exemplary embodiment, it is preferable that the material has a small work function and is chemically stable. Considering the chemical stability, the work function of the material used for the cathode layer 14 is preferably not less than 2.5 eV.

Specific examples of the material used for the cathode layer 14 include Al, MgAg alloy and alloys of Al and alkali metals such as AlLi and AlCa. The thickness of the cathode layer 14 is preferably in the range of 10 nm to 1 µm, and more preferably 50 nm to 500 nm.

In the case of the light-emitting device 10 to which the exemplary embodiment is applied, light emitted from the light-emitting portion 17 is extracted from the substrate 11 side. Therefore, the cathode layer 14 may be formed by an opaque material. In this case, the opaque material for forming the cathode layer 14 preferably has a high light reflectivity.

In general, a sheet resistance of a thin film with thickness of 100 nm composed of the transparent conductive material of metal oxides such as ITO is, 5Ω per square to 100Ω per square, and a sheet resistance of a thin film with thickness of 100 nm composed of the opaque metal material is 0.1Ω per square to 1Ω per square. The value of the sheet resistance depends on the film thickness, and the sheet resistance becomes smaller as the film thickness becomes thicker. Besides, the value of the sheet resistance varies due to existence or non-existence of fine holes such as concave portion 16. In many cases, though not able to generalize, the sheet resistance of the transparent electrode film is larger than that of the metal electrode film. In the light-emitting device 10 of the present exemplary embodiment, typical specific examples of the anode layer 12 and the cathode layer 14 include an ITO film with a thickness of 150 nm and an Al film with a thickness of 130 nm, respectively. In this case, since the sheet resistance of the anode layer 12 is larger than that of the cathode layer 14, the terminal of the present invention is an anode electrode terminal 15 that is electrically connected to the anode layer 12.

In the light-emitting device 10 of the present exemplary embodiment, the light emitted from the light-emitting portion 17 can be extracted from the cathode layer 14 side by forming the cathode layer 14 with ITO or the like, which is the transparent electrode. When forming the cathode layer 14 with ITO, for the purpose of lowering the electron injection barrier to the light-emitting portion 17, it is preferable to form a layer composed of a material used for the above cathode layer 14 between the cathode layer 14 and the light-emitting portion 17 with a thin thickness with which light can be transmitted, and the thickness thereof is preferably 1 nm to 30 nm.

In the light-emitting device 10 of the present exemplary embodiment, a first electrode layer formed to contact the substrate 11 is the anode layer 12, and a second electrode layer formed above the light-emitting portion 17 is the cathode layer 14, however, the anode layer 12 and the cathode layer 14 may be reversed each other. That is, the first electrode layer may be a cathode layer and the second electrode layer may be an anode layer. As materials for forming the anode layer and the cathode layer in this case, the same materials for the above anode layer 12 and the cathode layer 14 can be used, respectively.

Note that, the direction of extracting the light emitted from the light-emitting portion 17 to the outside of the light-emitting device 10 may be toward the anode layer 12 side or the cathode layer 14 side, and toward both the anode layer 12 side and the cathode layer 14 side.

(Shape of Concave Portion 16)

In the light-emitting device 10 of the present exemplary embodiment, the concave portion 16 is formed to pass through the anode layer 12 and the dielectric layer 13 formed on the substrate 11.

In the present exemplary embodiment, in the concave portion 16, the light-emitting portion 17 including a light-emitting material described later is formed. In the light-emitting portion 17, the holes injected from the anode layer 12 and the electrons injected from the cathode layer 14 are recombined in the region therebetween, thereby the light-emitting material emits the caused energy as light. Therefore, light emission tends to occur at a region where a distance from both the anode layer 12 and the cathode layer 14 is short.

Next, light emission of the light-emitting portion 17 in the concave potion 16 will be described.

Figure 4:
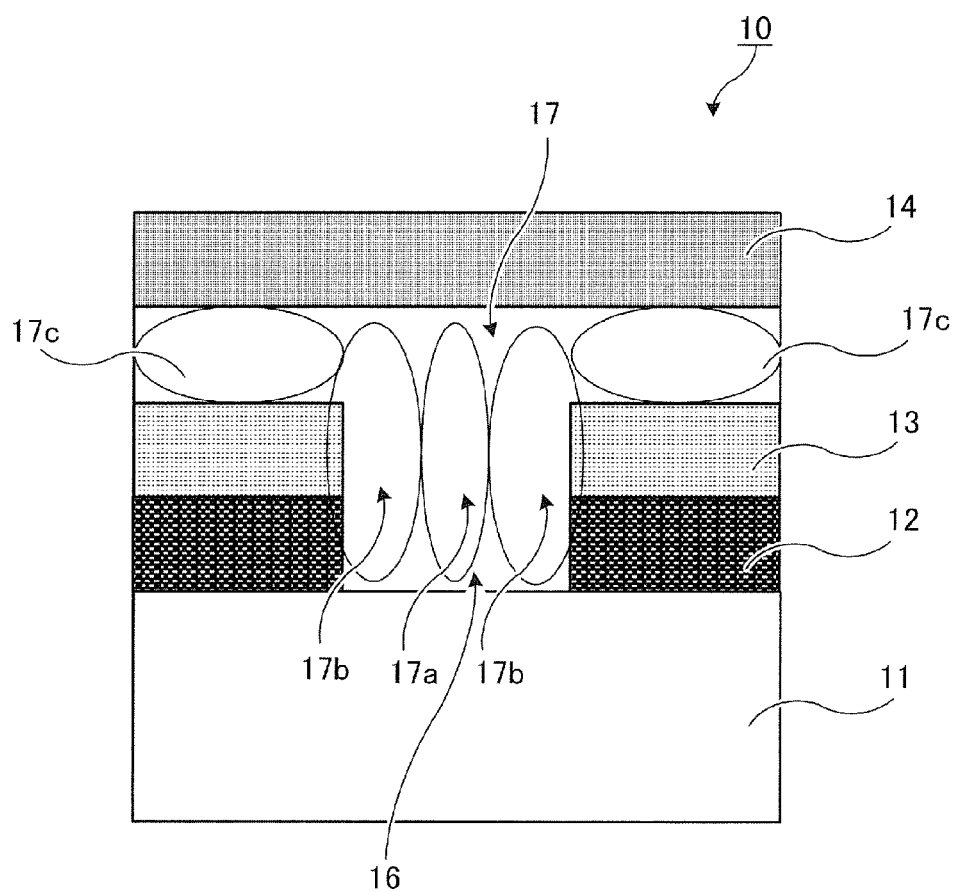
FIG. 4 is a diagram for illustrating a light-emitting site in the concave portion and the light-emitting portion.

FIG. 4 is a diagram for illustrating a light-emitting site in the concave portion 16 and the light-emitting portion 17.

As shown in FIG. 4, the light-emitting portion 17 is configured with; a center portion 17a of the concave portion 16; an edge region 17b that is a region to contact both the anode layer 12 and the cathode layer 14 in the concave portion 16; and an outer portion 17c that is a region to be located outside of the concave portion 16 and sandwiched with the dielectric layer 13 and the cathode layer 14.

In the light-emitting device 10 of the present exemplary embodiment, in the light-emitting portion 17, the edge region 17b is easier to emit light compared to the center portion 17a and the outer portion 17c. Therefore, in the present exemplary embodiment, the edge region 17b of the light-emitting portion 17 is the light-emitting site, and the center portion 17a and the outer portion 17c are the non-light-emitting sites. Thus, when a proportion of the edge region 17b occupied in the light-emitting region is made larger, the light is emitted with high brightness because the light-emitting sites are increased. On the other hand, when a proportion of the center portion 17a or the outer portion 17c is made larger, the light is hard to be emitted with high brightness because the non-light-emitting sites are increased.

Here, the "edge region 17b" in the light-emitting device 10 to which the present exemplary embodiment is applied is, viewed from a light extraction direction of the substrate 11, a region with a constant width that contacts the anode layer 12 and the dielectric layer 13 in the light-emitting portion 17 formed in the concave portion 16.

The "light-emitting site" is, among the light-emitting portion 17, a region where the light is substantially emitted viewed from the light extraction direction of the substrate 11. The "non-light-emitting site" is, among the light-emitting portion 17, a region where the light is hardly emitted in substance viewed from the light extraction direction of the substrate 11.

Further, with respect to the concave portion 16 formed in a particular region at the upper surface of the dielectric layer 13 in the light-emitting region, a value calculated by dividing a sum of a contour length (perimeter) of a planar shape (a concave shape) of the concave portion 16 with an area of the particular region is defined as an "edge density" in the particular region.

In the present exemplary embodiment, when a width of the concave portion 16 is made smaller, the width of the non-light-emitting sites in the center portion 17a of the concave portion 16 is relatively reduced compared to the edge region 17b, thereby the light-emitting brightness is easy to be increased. Note that, the "width of the concave portion 16" is a diameter of a minimum circle surrounding the planar shape.

Moreover, in the light-emitting region where the plural concave portions 16 are formed, when a gap between the adjacent concave portions 16 is made small and a density of the concave portions 16 is made large, the non-light-emitting sites of the outer portion 17c that is a region sandwiched with the dielectric layer 13 and the cathode layer 14 is reduced, thereby the light-emitting brightness is easy to be increased. Specifically, the gap between the adjacent concave portions 16 is preferably not more than 10 µm. Here, the gap between the adjacent concave portions 16 is a distance from a center of gravity of the concave portion 16 to a center of gravity of another concave portion 16 that is located nearest.

(Distribution Pattern of Concave Portions 16)

FIGS. 5A to 5E are diagrams for illustrating specific examples of a distribution pattern of the concave portions 16 (16a to 16o) in the light-emitting device 10 (100a to 100e) to which the present exemplary embodiment is applied. Same symbols are assigned to configurations same as those in FIG. 2, and description thereof will be omitted. FIGS. 5A to 5E are planar diagrams in which the light-emitting device 10 is viewed from the light extraction direction.

Note that, FIGS. 5A to 5E conceptually illustrate the size and arrangement of the concave portions 16 (16a to 16o), therefore the configuration of the present invention is not limited thereto. For example, the shape of the concave portions 16 (16a to 16o) may be, for example, elliptic, convex polygon or amorphous other than circle or concave polygon shown in the figure.

The arrangement of the plural concave portions 16 (16a to 16o) may be, other than the arrangement with lattice pattern shown in FIGS. 5A to 5E, an arrangement in which the concave portions 16 (16a to 16o) are arranged as the edge density becomes large at a portion where a voltage drop is large according to the distribution of voltage drop due to a distance from the anode electrode terminal 15 or the like.

The planar shape of one concave portion 16 (16a to 16o) is not particularly limited. In the present exemplary embodiment, from a viewpoint of facilitating the design and the production, circular shape or polygonal shape is preferable. The maximum width of one concave portion 16 (16a to 16o)

is preferably not more than 10 µm, more preferably 0.1 µm to 5 µm, further preferably 0.1 µm to 1 µm. Moreover, the concave portions 16 (16a to 16o) are preferably formed $10^2$ to $10^8$ per 1 mm square in an arbitrary surface of the substrate 11.

In the light-emitting device 10 (100a to 100e) to which the present exemplary embodiment is applied, the edge region 17b relatively emits more light compared to the center portion 17a and the outer portion 17c. Therefore, the light-emitting intensity is increased by increasing the edge density.

As a method of increasing the edge density, for example, methods (1) to (3) shown below are exemplified to vary the distribution of the concave portions 16 (16a to 16o).

(1) To increase a number of the concave portions 16 (16a to 16o) per unit area without changing the shape and the size of the concave portions 16 (16a to 16o).

(2) To reduce the size and gap of the concave portions 16 (16a to 16o) with the same proportion without changing the shape of the concave portions 16 (16a to 16o).

(3) To use the shape of the concave portions 16 (16a to 16o) that include more edge region.

In the light-emitting device 10, non-uniform light-emission in the light-emitting region tends to be resolved by increasing the edge density successively or gradually from a position near the anode electrode terminal 15 to a position far from the anode electrode terminal 15. Hereinbelow, for the convenience of expression, FIGS. 5A to 5E are used to explain in which the edge density is successively changed from a position near the anode electrode terminal 15 in the light-emitting device 10 to a position far therefrom, however, the present exemplary embodiment is not limited thereto and the edge density may be changed gradually.

FIG. 5A is a diagram for illustrating a specific example of a distribution state pattern of concave portions 16a to 16c in the light-emitting device 100a in which the anode electrode terminal 15 is connected to only one edge of the anode layer 12. In the light-emitting device 100a, the plural concave portions 16a to 16c that have the same shape (circular shape) and the same area are formed in a whole of the light-emitting region. As shown in FIG. 5A, the light-emitting region has three sub-regions, that is, region a, region b and region c from the side near to the anode electrode terminal 15. In a region a that is located near the anode electrode terminal 15, the concave portions 16a are sparsely formed compared to a region b that is located adjacent to the region a and relatively far from the anode electrode terminal 15. Moreover, in a region c that is located adjacent to the region b and the farthest from the anode electrode terminal 15, the concave portions 16c are formed most densely in the whole of the light-emitting region of the light-emitting device 100a. That is, in the light-emitting device 100a, as the region is located relatively farther from the anode electrode terminal 15, the plural concave portions 16a to 16c are formed to be more dense (pitches become narrower) gradually.

As described above, the light-emitting device 10a is designed from a viewpoint that the number of the concave portions 16a to 16c per unit area is increased. Thereby, in a part relatively far from the anode electrode terminal 15, the edge density of the concave portions 16c is increased compared to the concave portions 16a, accordingly, the effect of the voltage drop is offset, then an element that uniformly emits light is gained.

FIG. 5B is a diagram for illustrating a specific example of a distribution state pattern of concave portions 16d to 16f in a light-emitting device 100b in which the anode electrode terminal 15 is connected to only one edge of the anode layer 12. In the light-emitting device 100b, the light-emitting region has three sub-regions, that is, region d, region e and region f from the side near to the anode electrode terminal 15. The concave portions 16d formed in a region d nearest the anode electrode terminal 15 is formed to have a circular shape, the concave portions 16e formed in a region e adjacent to the region d and slightly far from the anode electrode terminal 15 is formed to have a depressed decagonal shape and the concave portions 16f formed adjacent to the region e and farthest from the anode electrode terminal 15 is formed to have a depressed dodecagonal shape.

The concave portions 16d to 16f in the light-emitting device 100b are formed so that the areas occupied with each planar shape thereof are substantially the same. The depressed polygonal shape can have a longer perimeter compared to the minimum circle surrounding the depressed polygonal shape. Therefore, when using the concave portions 16e and 16f, the edge density can be set higher than using the concave portions 16d with a circular shape.

The light-emitting device 100b shown in FIG. 5B is designed from a viewpoint of using concave portions 16e and 16f with a shape including more edge regions. Moreover, planar shapes at the upper surface of the dielectric layer 13 (refer to FIG. 2) preferably include at least two shapes that are not similar to each other.

Since the edge density is easy to be high by increasing a number of points of concave polygons which have an inner angle of more than 180 degrees, it is preferable that the concave polygons with more number of points are used as the distance from the anode electrode terminal 15 becomes far. Further, even if the number of points of the concave polygons is the same, the edge density can be high by making the inner angle of less than 180 degrees smaller. Thereby, in a part far from the anode electrode terminal 15, the edge density of the concave portions 16e and 16f is increased compared to the concave portions 16d, accordingly, the effect of the voltage drop is offset, then an element that uniformly emits light is gained.

In the case of the light-emitting device 100b shown in FIG. 5B, even when it is difficult to make the gap between the concave portions 16d to 16f narrower, the brightness can be increased by using the shape with more edge regions.

Moreover, in the case where the number of the concave portions 16 (16d to 16f) per unit area is the same, when the concave portions 16 (16d to 16f) are formed so that a ratio of areas occupied with the planar shape of the concave portions 16 (16d to 16f), that is, an area occupation ratio at the upper surface of the dielectric layer 13 (refer to FIG. 2) are substantially same each other in an arbitrary region, it is preferable since unevenness in film thickness is hard to be generated when forming the light-emitting portion 17 (refer to FIG. 2). Further, when respective areas of the concave portions 16 (16d to 16f) at the upper surface of the dielectric layer 13 are equal to each other and respective depths of the concave portions 16 (16d to 16f) are equal to each other, respective volumes of are the concave portions 16 (16d to 16f) are also equal to each other, thus it is more preferable since unevenness in film thickness in each of the concave portions 16 (16d to 16f) is hard to be generated when forming the light-emitting portion 17 (refer to FIG. 2).

Next, other than the light-emitting device 100b shown in FIG. 5B, a light-emitting device will be described for explaining another exemplary embodiment that including at least two types of shapes of the concave portions 16 that are not similar to each other.

FIG. 5C is a diagram for illustrating a specific example of a distribution pattern of the concave portions 16g to 16h in the light-emitting device 100c in which the anode electrode terminal 15 is formed so as to surround the all sides of the anode layer 12. In the light-emitting device 100c, the light-emitting region has two sub-regions, that is, region g and region h from the side near to the anode electrode terminal 15. In these sub-regions, concave portions 16g (circular: a region g) and concave portions 16h (depressed decagonal: a region h) are formed, which are at least two types of shapes that are not similar to each other. Compared to the concave portions 16g formed in the region g that is the edge portion of the light-emitting region near the anode electrode terminal 15, the concave portions 16h formed in the region h that is the center portion of the light-emitting region relatively far from the anode electrode terminal 15 are formed in the depressed decagonal shape with a long perimeter. Therefore, the edge density in the region h is higher than that in the region g, accordingly, the effect of the voltage drop is offset, then an element that uniformly emits light is gained.

FIG. 5D is a diagram for illustrating a specific example of a distribution pattern of the concave portions 16i to 16l in the light-emitting device 100d in which the anode electrode terminal 15 connected to only one edge of the anode layer 12. The light-emitting device 100d is designed from a viewpoint for setting the width of the concave portions 16i to 16l to be small and for increasing the number of the concave portions 16i and 16l per unit area as the concave portions are located far from the anode electrode terminal 15.

In the light-emitting device 100d, the light-emitting region has four sub-regions, that is, region i, region j, region k and region l from the side near to the anode electrode terminal 15. In these sub-regions, all of the plural concave portions 16i to 16l have a similar circular shape in planar shape at the upper surface of the dielectric layer 13 (refer to FIG. 2), and are arranged to be located relatively far from the anode electrode terminal 15 in the order of the concave portions 16i, 16j, 16k, and 16l.

In the light-emitting device 100d, the number of the concave portions 16j per unit area in a region j is more than the number of the concave portions 16i per unit area in a region i that is adjacent to the region j and nearest the anode electrode terminal 15. Further, the number of the concave portions 16k per unit area in a region k that is adjacent to the region j and relatively far from the anode electrode terminal 15 compared to the region j is more than the number of the concave portions 16j per unit area in the region j. Still furthermore, the number of the concave portions 16l per unit area in a region l that is adjacent to the region k and relatively farthest from the anode electrode terminal 15 is more than the number of the concave portions 16k per unit area in the region k.

Moreover, the concave portions 16i to 16l are formed so that the width of the concave portions 16j in the region j smaller than the width of the concave portions 16i in the region i, the width of the concave portions 16k in the region k smaller than the width of the concave portions 16j in the region j, and the width of the concave portions 16l in the region l smaller than the width of the concave portions 16k in the region k.

Furthermore, the concave portions 16 are formed to make a similar pattern in which the shape of the concave portions 16 and the ratio of the width of the concave portions 16 and the gap between of the concave portions 16 in each area are the same, thus the edge density in each area is sequentially increased from the region i that is nearest the anode electrode terminal 15 to the region l that is the farthest from the anode electrode terminal 15.

In the light-emitting device 100d, for example, the width of the concave portions 16l in the region l that is relatively far from the anode electrode terminal 15 is made smaller compared to that of the concave portions 16i in the region i that is nearest the anode electrode terminal 15, and the density of the concave portions 16l in the region 1 is made increased compared to that of the concave portions 16i in the region i, thereby the difference in the edge density in the light-emitting region of the light-emitting device 100d can be increased compared to the case where the concave portions 16 have the same size.

As described above, it is preferable in manufacturing that the plural concave portions 16 form a pattern that is repeatedly formed in a predetermined region, and that a pattern of the region relatively far from the anode electrode terminal 15 and a pattern of the region relatively near the anode electrode terminal 15 are the similar pattern in which the shape of the concave portions 16 and the ratio of the width of the concave portions 16 and the gap between of the concave portions 16 are the same.

FIG. 5E is a diagram for illustrating a specific example of a distribution pattern of the concave portions 16m to 16o in the light-emitting device 100e in which the anode electrode terminal 15 is formed so as to surround the all sides of the anode layer 12.

In the light-emitting device 100e, the light-emitting region has three sub-regions, that is, region m, region n and region o from the side near to the anode electrode terminal 15. In the light-emitting region, the planar shapes of the concave portions 16m (a region m), the concave portions 16n (a region n) and the concave portions 16o (a region o) are the same or similar to each other. Compared to the concave portions 16m formed in the region m that is the edge portion of the light-emitting region near the anode electrode terminal 15, the concave portions 16o formed in the region o that is the center portion of the light-emitting region relatively far from the anode electrode terminal 15 have a narrower width, and the number of the concave portions 16o per unit area in the region o is more than the number of the concave portions 16m per unit area in the region m.

Further, the concave portions 16o in the region o are formed to make a similar pattern in which the shape of the concave portions 16m and the ratio of the width of the concave portions 16m and the gap between the concave portions 16m in the region m are the same. Thereby, the edge density in the region o can be higher than that in the region m.

The concave portions 16n formed in the region n that is farther from the anode electrode terminal 15 than the region m and nearer than the region o are middle in size and number per unit area between the concave portions 16m and the concave portions 16o, and the shape of the concave portions 16n and the ratio of the width of the concave portions 16n and the gap between the concave portions 16n in the region n are formed to be same as those of the concave portions 16m and 16o in the regions m and o. Therefore, the edge density in the region n is larger than that in the region m and smaller than that in the region o.

Figure 6A:
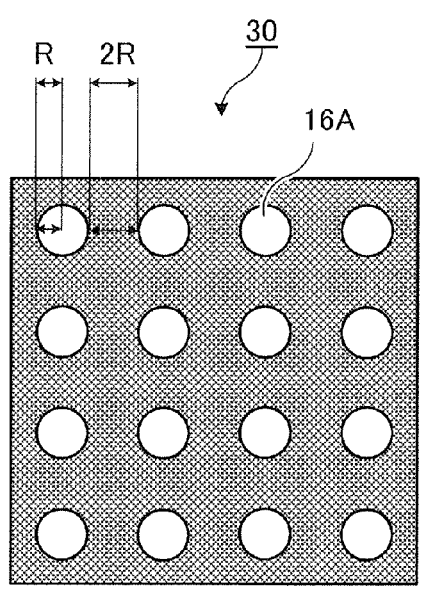
FIGS. 6A and 6B are diagrams for illustrating specific examples of patterns of the plural concave portions; the patterns are similar to each other.
Figure 6B:
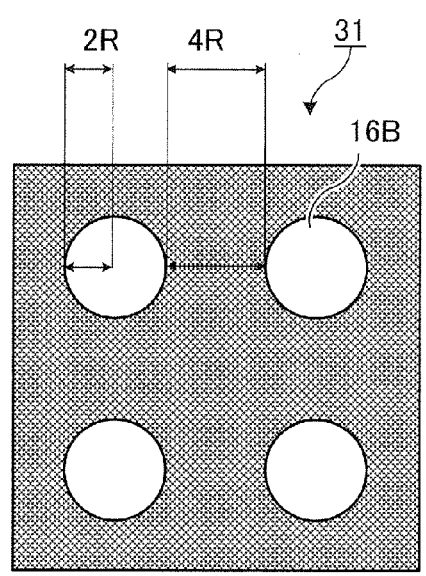

FIGS. 6A and 6B are diagrams for illustrating specific examples of patterns of the plural concave portions 16; the patterns are similar to each other.

A pattern 30 shown in FIG. 6A and a pattern 31 shown in FIG. 6B are formed so that the patterns are circular in the planar shape in concave portions 16A and 16B and are similar, the ratio of the width of the concave portions and the gap between the concave portions is same, and the pattern 30 is a reduced pattern of the pattern 31.

The pattern 30 shown in FIG. 6A is a pattern in which the concave portions 16A are arranged in a square-lattice supposing the radius of the concave portion 16A to be R and the distance from the adjacent concave portion 16A to be 2R. The pattern 31 shown in FIG. 6B is a pattern in which the concave portions 16B are arranged in a square-lattice supposing the radius of the concave portion 16B to be 2R and the distance from the adjacent concave portion 16B to be 4R. The pattern 30 is a similar pattern of the pattern 31 with a half size.

Here, the total area of the concave portions 16A (the number thereof is 16) in the pattern 30 is $16\pi R^2$, the total area of the concave portions 16B (the number thereof is 4) in the pattern 31 is $16\pi R^2$, the summation of the contour length of the concave portion 16A (the number thereof is 16) in the pattern 30 is $32\pi R$, and the summation of the contour length of the concave portion 16B (the number thereof is 4) in the pattern 31 is $16\pi R$. As described, when using a reduced pattern in which the planar shape of the concave portions and the ratio of the width of the concave portions and the gap between the concave portions are kept constant, the edge density is increased since the size in each concave portion becomes small although the area occupation ratio of the planar shape of the concave portions is same.

Those patterns are preferable because they are easy to be manufactured only by changing the reduction ratio at the time of patterning with projection exposure. Moreover, it is preferable in manufacturing since it is easy to form the concave portions 16 so that the area occupation ratio of the planar shape of the concave portion 16 at the upper surface of the dielectric layer 13 is substantially same in an arbitrary region.

(Light-Emitting Portion 17)

In the present exemplary embodiment, the light-emitting portion 17 includes a light-emitting material that emits light by application of voltage and current supply, and is formed by applying the material so as to be in contact with an inner surface of the concave portion 16. In particular, in the case where the light-emitting portion 17 is formed with plural layers including a layer composed of an organic compound, the layer including the light-emitting material is called a light-emitting layer. In the light-emitting portion 17, holes injected from the anode layer 12 and the electrons injected from the cathode layer 14 are recombined, and light emission occurs.

As the material of the light-emitting material, either an organic material or an inorganic material may be used. In the case where an organic material is used as the light-emitting material (a luminescent organic material), either a non-polymeric compound or a polymeric compound may be used. Specific examples may include luminescent non-polymeric compound and luminescent polymeric compound described in Oyo Butsuri (Applied Physics), Vol. 70, No. 12, pages 1419-1425 (2001) written by Yutaka Ohmori.

As the luminescent organic material, a phosphorescent organic compound and a metal complex are preferable. Among the metal complexes, there exist ones that show phosphorescence, and such metal complexes are also preferably used. In the present exemplary embodiment, in particular, it is exceptionally desirable to use cyclometalated complexes in terms of improving light emission efficiency. As the cyclometalated complexes, complexes of Ir, Pd, Pt and the like including ligands such as 2-phenylpyridine derivatives, 7,8-benzoquinoline derivatives, 2-(2-thienyl)pyridine derivatives, 2-(1-naphthyl)pyridine derivatives, 2-phenylquinoline derivatives are provided, and iridium (Ir) complexes are especially preferred. The cyclometalated complexes may include ligands other than the ligands required to form the cyclometalated complexes. Note that the cyclometalated complexes are preferable in terms of improving light emission efficiency because compounds that emit light from triplet exciton are included therein.

As the polymeric compound, specific examples include; poly-p-phenylenevinylene (PPV) derivatives such as MEH-PPV (poly[2-methoxy-5-(2-ethylhexyloxy)-1,4-phenykenevinylene]); polymer compounds of a π-conjugated system such as polyfluorene derivatives and polythiophene derivatives; polymers introducing low-molecular pigments and tetraphenyldiamine or triphenylamine to a main chain or a side chain and the like. The light-emitting polymer compounds and light-emitting low-molecular compounds can be used in combination.

The light-emitting layer includes the light-emitting material and a host material, and the light-emitting material is dispersed in the host material in some cases. It is preferable that the host material has charge transporting properties, and it is also preferable that the host material is a hole-transporting compound or an electron-transporting compound.

In the present exemplary embodiment, the light-emitting portion 17 may include a hole-transporting layer to receive a hole from the anode layer 12 and transport the hole to the light-emitting layer. As the hole-transporting materials for forming the hole-transporting layer, publicly known materials can be used. Specific examples thereof include low molecular triphenylamine derivatives such as: TPD (N,N'-diphenyl-N,N'-bis(3-methylphenyl)-1,1'-biphenyl-4,4' diamine); α-NPD (4,4'-bis[N-(1-naphthyl)-N-phenylamino] biphenyl); and m-MTDATA (4,4',4"-tris(3-methylphenylamino)triphenylamine). In addition, examples also include: polyvinylcarbazole; and triphenylamine derivative-based high-molecular compound polymerized by introducing a polymerizable functional group. The above hole-transporting materials may be used solely or by mixing two or more, and may be used by laminating different hole-transporting materials.

To mediate a hole injection barrier, a hole injection layer may be provided between the above hole-transporting layer and the anode layer 12. As a material for forming the hole injection layer, publicly known materials such as copper phthalocyanine, a mixture of poly-ethylendioxythiophene (PEDOT) and polystyrene sulfonate (PSS) (PEDOT:PSS), fluorocarbon and silicon dioxide may be used, and a mixture of the hole-transporting materials used for the above hole-transporting layer and electron acceptors such as 2,3,5,6-tetrafluorotetracyano-1,4-benzoquinodimethane (F4TCNQ) may be used.

Further, in the present exemplary embodiment, the light-emitting portion 17 may include an electron transporting layer for transporting an electron from the cathode layer 14 to the light-emitting layer. The material which can be used for the electron transporting layer includes; quinolinic derivatives, oxiadiazole derivatives, perylene derivatives, pyridine derivatives, pyrimidine derivatives, quinoxaline derivatives, diphenylquinone derivatives, nitro displacement fluorene derivatives or the like. More specifically, tris(8-quinolinolato)aluminium (abbreviated expression: Alq), bis[2-(2-hydroxyphenyl)benzothiazolato]zinc, 2-(4-biphenylyl)-5-(4-tert-butylphenyl)-1,3,4-oxadiazol can be used.

Moreover, for the purpose of suppressing holes from passing through the light-emitting layer and efficiently recombining holes and electrons in the light-emitting layer, a hole-block layer may be provided between the above electron transporting layer and the light-emitting layer. In order to form the above hole-block layer, publicly known materials such as a triazine derivative, an oxadiazole derivative, a phenanthroline derivative or the like may be used. This hole-block layer may be considered as one of layers included in the light-emitting portion 17.

The thickness of each layer configuring the light-emitting portion 17 can be arbitrarily selected considering charge mobility, charge injection balance, interruption of emitted light and the like, therefore it is not generally limited. In the present exemplary embodiment, the thickness is preferably in the range of 1 nm to 1 µm, more preferably 2 nm to 500 nm, further preferably 5 nm to 200 nm. Moreover, the thickness of the light-emitting portion 17 summed up with thickness of each layer is, between the anode layer 12 and the cathode layer 14, preferably in the range of 30 nm to 1 µm, more preferably 50 nm to 500 nm.

To lower the barrier for the electron injection from the cathode layer 14 into the light-emitting portion 17 and thereby to increase the electron injection efficiency, a cathode buffer layer may be provided adjacent to the cathode layer 14. The cathode buffer layer is required to have a lower work function than the cathode layer 14. Metal materials are preferably used for forming the cathode buffer layer. Specifically, for example, the material thereof includes alkali metals (Na, K, Rb and Cs), magnesium (Mg), alkaline earth metals (Ca, Sr and Ba), rare earth metals (Pr, Sm, Eu and Yb), one selected from fluoride, chloride and oxide of these metals and mixture of two or more selected therefrom. The thickness of the cathode buffer layer is preferably in the range of 0.05 nm to 50 nm, more preferably 0.1 nm to 20 nm, and still more preferably 0.5 nm to 10 nm.

For the light-emitting device 10 in the present exemplary embodiment, the inorganic material can be used as the light-emitting body as described above. An electroluminescent element using the inorganic material can be considered as an inorganic electroluminescent element. As the inorganic material, for example, an inorganic phosphor is exemplified. The specific example of the inorganic phosphor and the configuration and manufacturing method of the electroluminescent element is exemplified by the ones described in the Japanese Patent Application Laid-Open Publication No. 2008-251531.

(Anode Electrode Terminal 15)

The anode electrode terminal 15 is electrically connected to the anode layer 12, thereby connects the anode layer 12 to a power supply (not shown in the figure). In the present exemplary embodiment, the anode electrode terminal 15 is connected to the anode layer 12 as a first electrode layer that shows higher property in sheet resistance compared to the cathode layer 14 as second electrode layer.

<Method of Manufacturing a Light-Emitting Device>

Next, a method of manufacturing a light-emitting device 10 will be explained with reference to the drawings.

FIGS. 7A to 7H are diagrams for illustrating a specific example of a method of manufacturing the light-emitting device 10 to which the present exemplary embodiment is applied.

First, as shown in FIG. 7A, the anode layer 12 is formed on the substrate 11 (a first electrode layer forming process), then the dielectric layer 13 is laminated on the anode layer 12. For forming these layers, a resistance heating deposition method; an electron beam deposition method; a sputtering method; an ion plating method; and a Chemical Vapor Deposition (CVD) method or the like can be used. Note that, if it is possible to employ a method in which the intended material in a state of being dissolved in a solvent is coated to the substrate 11 and dried, a coating film-forming method is preferable. Specific examples of the coating film-forming method include; a spin coating method; a dip coating method; an ink-jet printing method; a printing method; a spray-coating method; and a dispenser-printing method or the like.

Next, the concave portions 16 are formed with a method using a photolithography (a concave portion forming process).

First, as shown in FIG. 7B, a resist solution is coated on the dielectric layer 13 and then an excess resist solution is removed by spin coating or the like to form a resist layer 71. Thereafter, the resist layer 71 is exposed by ultraviolet light (UV), an electron beam (EB) or the like through a mask (not shown in the figures) in which a predetermined pattern is drawn. In the pattern of the mask (mask pattern: basic pattern), openings that correspond to the shapes of the concave portions 16 described above are regularly arranged. As a result, a predetermined pattern corresponding to the concave portions 16 is exposed onto the resist layer 71.

Thereafter, as shown in FIG. 7C, non-exposure portions of the resist layer 71 are removed by use of a developing solution. By this process, the surface of the dielectric layer 13 is exposed so as to correspond to the exposed pattern.

Here, for example, by performing a same magnification exposure such as a contact exposure or proximity exposure and the like, the pattern of the concave portions 16 having the same magnification with the mask pattern of the resist layer 71 is formed. Moreover, for example, by performing a reduced magnification exposure such as a projection exposure and the like, the pattern of the concave portions 16 having the reduced magnification with respect to the mask pattern of the resist layer 71 (reduced pattern) is formed.

In the present exemplary embodiment, the exposure is performed to a certain region of the resist layer 71 with a certain reduction ratio by using a photomask of a pattern (basic pattern) having been formed in advance. Further, a reduced magnification exposure is performed to another region with a different reduction ratio by using the same photomask, then the pattern (reduced pattern) corresponding to the plural concave portions 16 is formed on the whole surface of the light-emitting region. It should be noted, a reduction ratio is the ratio of the size (for example, a width) of the planar shape of a concave portion 16 of reduced pattern to the size of the planar shape of a concave portion 16 of basic pattern. With this method, the pattern corresponding to a desired light-emitting device can be easily formed, which is preferable in productivity.

As described above, in the manufacturing method to which the present exemplary embodiment is applied, in the light-emitting device 10, when forming the pattern of the concave portions 16 at a region far from the anode electrode terminal 15, the mask pattern (basic pattern) of the photomask used in forming the pattern at a region nearest the anode electrode terminal 15 is used by reducing (reduced pattern). By using a reduced pattern, a pattern with high edge density can be easily formed. Moreover, the area occupation ratio of the planar shapes of the concave portions 16 at the upper surface of the dielectric layer 13 becomes the same between arbitrary portions in the light-emitting region.

Then, as shown in FIG. 7D, by using the remaining resist layer 71 as a mask, exposed portions of the dielectric layer 13 are removed by etching. Either dry etching or wet etching may be used as the etching. Further, by combining isotropic etching and anisotropic etching at this time, the shape of the concave portions 16 can be controlled. Reactive ion etching (RIE) using inductive coupling plasma or the same is used as the dry etching. Further, a method of immersing the substrate 11 in diluted hydrochloric acid, diluted sulfuric acid, or the like is used as the wet etching. By this etching, the surface of the anode layer 12 is exposed to correspond to the above mask pattern.

Subsequently, as shown in FIG. 7E, the residual resist layer 71 on the dielectric layer 13 is removed by using a resist removing solution.

Next, as shown in FIG. 7F, by using the remaining dielectric layer 13 as a mask, exposed portions of the anode layer 12 are removed by etching. The same method of etching the dielectric layer 13 may be used as the etching. Note that, the etching condition is changed so as to selectively perform the etching to the anode layer 12 without influencing on the dielectric layer 13. Thereby, the surface of the substrate 11 is exposed to correspond to the above mask pattern, then the concave portions 16 are formed.

Note that, by controlling etching conditions (a process time, gases to be used, pressure, and a substrate temperature) in performing the etching, a predetermined portion of the plural layers having been formed on the substrate 11 can be removed at the same time so that the concave portions 16 are in a state of being passed through. For example, it is possible that the resist layer 71 and the dielectric layer 13 are removed at the same time, or the resist layer 71, the dielectric layer 13 and the anode layer 12 are removed at the same time.

Next, as shown in FIG. 7G, the light-emitting portion 17 is formed on the substrate 11 (an organic compound layer forming process). For forming the light-emitting portion 17, a coating method or a vapor deposition method are used. In the coating method, specifically, a light-emitting material solvent in which the light-emitting material is dispersed in a predetermined solvent such as an organic solvent is coated. To perform coating, various methods such as a spin coating method, a spray coating method, a dip coating method, an ink-jet method, a slit coating method, a dispenser method and a printing method may be used. After the coating is performed, the light-emitting material solution is dried by heating or vacuuming, and thereby the light-emitting material is stuck to the inner surface of the concave portions 16 to form the light-emitting portion 17 spread on dielectric layer 13.

Next, as shown in FIG. 7H, the cathode layer 14 as a second electrode layer is formed on the light-emitting portion 17 (a second electrode layer forming process). For forming the cathode layer 14, the method same as that in forming the anode layer 12 can be used.

By the aforementioned processes, the light-emitting device 10 can be manufactured. In the present exemplary embodiment, a protective layer or a protective cover (not shown in the figure) for stably using the light-emitting device 10 for long periods and protecting the light-emitting device 10 from outside may be mounted. As the protective layer, polymer compounds, metal oxides, metal fluorides, metal borides, silicon nitrides and silicon oxides may be used. A lamination thereof may also be used.

As the protective cover, glass plates, plastic plates with a surface treated with low hydraulic permeability, or metals may be used. The protective cover may be bonded to the substrate 11 by using a thermosetting resin or a photo-curable resin to be sealed. At this time, spacers may be used so that predetermined spaces between the protective cover and the substrate 11 are maintained, thus the prevention of scratches on the light-emitting device 10 is facilitated. Filling the spaces with inert gases such as nitrogen, argon and helium prevents the oxidation of the cathode layer 14 on the upper side. Especially, in a case of using helium, high thermal conductivity thereof enables heat generated from the light-emitting device 10 upon application of voltage to be effectively transmitted to the protective cover. In addition, by putting desiccants such as barium oxide in the spaces, the light-emitting device 10 is easily prevented from being damaged by moisture absorbed in the sequence of the aforementioned manufacturing processes.

In the present exemplary embodiment, the case where an organic light-emitting element is used as a light source is explained as a specific example, however, the light-emitting element may be manufactured by replacing the light source with another one with the same size.

Second Exemplary Embodiment

Figure 8:
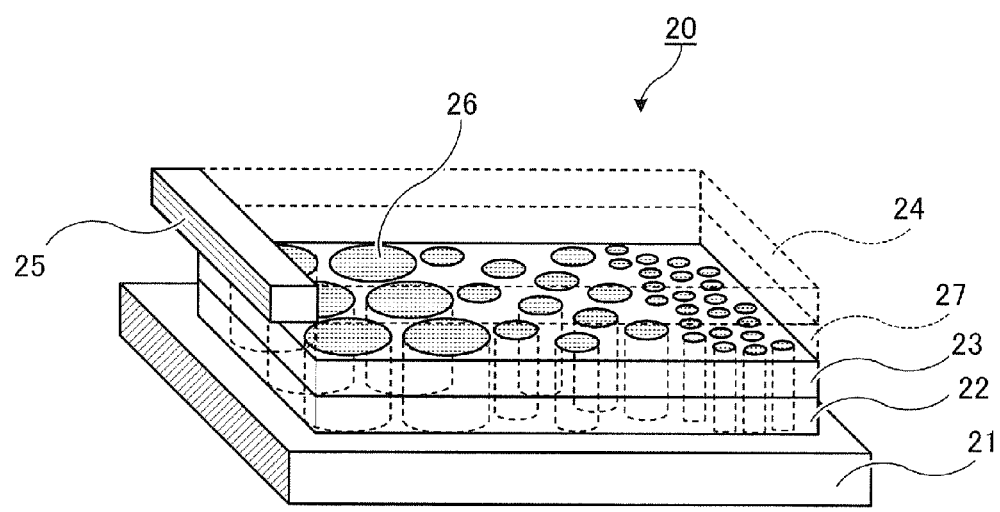
FIG. 8 is a diagram for illustrating the second exemplary embodiment of a light-emitting device in the present exemplary embodiment.

FIG. 8 is a diagram for illustrating the second exemplary embodiment of a light-emitting device in the present exemplary embodiment.

In a light-emitting device 20 shown in FIG. 8, a substrate 21, an anode layer 22 as a first electrode layer for injecting holes, which is formed on the substrate 21 in the case where the substrate 21 side is assumed to be the downside, and a dielectric layer 23 that is formed on the anode layer 22 and has an insulating property are stacked in order, which is the same as in the light-emitting device 10 (refer to FIG. 1). Moreover, similarly to the light-emitting device 10, plural concave portions 26 that pass through the anode layer 22 and the dielectric layer 23 are formed, and a light-emitting portion 27 that is formed successively from an upper surface of the dielectric layer 23 to an inner surface of the concave portion 26 is formed. On an upper part of the light-emitting portion 27, a cathode layer 24 as a second electrode layer for injecting electrons is laminated. Here, the light-emitting portion 27 also includes a light-emitting layer emitting light with application of voltage between the anode layer 22 and the cathode layer 24.

Specific explanation on each configuration above in the light-emitting device 20 is the same as that on each configuration corresponding to the light-emitting device 10 (refer to FIG. 1). Note that, the light-emitting region in the light-emitting device 20 is a region including the configurations of the anode layer 22, the dielectric layer 23, the light-emitting portion 27 and the cathode layer 24 and includes all the plural concave portions 26 as seen from the upper direction of the light-emitting device 20 (the direction perpendicular to the plane of the substrate 21).

In the light-emitting device 20, a cathode electrode terminal 25 as a terminal which is electrically connected to the cathode layer 24 and connects the cathode layer 24 to a power supply (not shown in the figure) is formed outside of the light-emitting region. That is, the light-emitting device 20 is different from the light-emitting device 10 in the point that a sheet resistance of the cathode layer 24 as the second electrode layer is larger than that of the anode layer 22 as the first electrode layer and that the terminal in the light-emitting device 20 is the cathode terminal that connects the cathode layer 24 as the second electrode layer to a power supply. As a specific example of the light-emitting device 20, a light-emitting device in which the anode layer 22 is composed of a opaque metal film, the cathode layer 24 is a conductive film composed of metal oxide such as ITO, and the light emitted from the light-emitting portion 27 is extracted from the cathode layer 24 side is exemplified. As described above, when the film thickness is similar, the sheet resistance of transparent conductive film of metal oxide is usually larger than that of metal film.

In the light-emitting device 20, a first electrode layer formed to contact the substrate 21 is the anode layer 22, and a second electrode layer formed above the light-emitting portion 27 is the cathode layer 24, however, the anode layer 22 and the cathode layer 24 may be reversed each other. Moreover, the direction of extracting the light emitted from the light-emitting portion 27 to the outside of the light-emitting device 20 may be toward the anode layer 22 side or the cathode layer 24 side, and toward both the anode layer 22 side and the cathode layer 24 side.

EXAMPLES

Hereinafter, the present invention will be described further in detail with reference to examples. However, the present invention is not limited to the following examples as long as the scope of the gist thereof is not exceeded.

Example 1

Preparation of Light-Emitting Material Solution (Synthesizing of a Phosphorescent Light-Emitting Polymer Compound)

A phosphorescent light-emitting polymer compound (A) was prepared in accordance with the method disclosed in the paragraph [0077] of International Publication No. WO2010-016512. The weight-average molecular weight of polymer compound (A) was 52000, and molar ratio of each repeating unit was k:m:n=6:42:52.

[Chemical Formula 1]

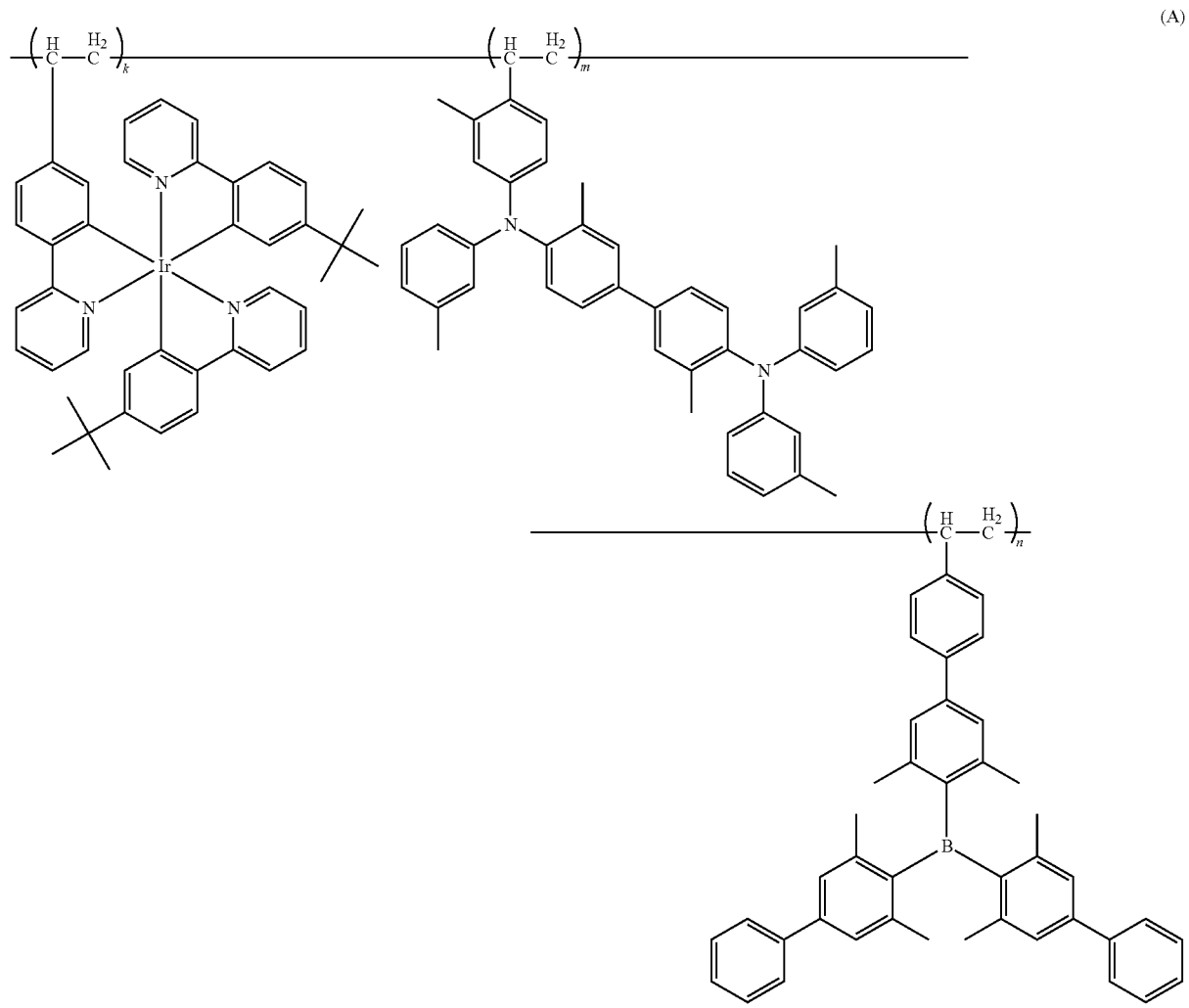

(A)

A light-emitting material solution (hereinafter, also referred to as "solution A") was prepared by dissolving 3 parts by weight of the light-emitting polymer compound prepared (A) in 97 parts by weight of toluene.

[Preparation of Organic Light-Emitting Element]

A light-emitting device 1 having the similar cross-sectional shape as shown in FIG. 2 was produced in accordance with the order shown in FIG. 7.

A glass substrate (=the substrate 11: 110 mm square, 1 mm in thickness) in which ITO film (=the anode layer 12: 150 nm in thickness, sheet resistance 10Ω per square) with a pattern that corresponds to the light-emitting region of 100 mm square was formed on the surface thereof was performed an ultrasonic cleaning in the order of surface acting agent, pure water and isopropanol. The glass substrate with ITO after cleaning was mounted to the inside of a plasma generation device, and oxygen plasma was irradiated for 5 seconds in the condition that the pressure in the device was 1 Pa and the supplied power was 50 W. Note that, the anode electrode terminal 15 (refer to FIG. 1) was formed only on one side of the light-emitting region of 100 mm square.

Next, the glass substrate with ITO was placed in a sputtering device, and a silicon dioxide layer ($SiO_2$) in film thickness of 50 nm (=the dielectric layer 13) was formed on a whole light-emitting region by sputtering method.

Subsequently, a photoresist (AZ1500 manufactured by AZ Electronic Materials) of about 1 μm in film thickness was formed by a spin coating method, thereby the resist layer 71 (refer to FIGS. 7A to 7H) was laminated on the whole glass substrate in which ITO and $SiO_2$ layers were formed.

Next, on a quartz (having a thickness of 3 mm) as a substrate, a mask A on which a pattern consists of circles with a diameter of 5 μm arranged in a square lattice with a pitch of 10 μm was produced, and exposure was performed with respect to the region p with 20 mm width from the anode electrode terminal 15 of the light-emitting region, in a reduction ratio of 10/50 by use of a stepper exposure device. Then, exposure was performed with respect to the region q with 20 mm width adjacent to the exposed region p in a reduction ratio of 9/50, then exposure was performed with respect to the region r with 20 mm width adjacent to the exposed region q in a reduction ratio of 8/50, then exposure was performed with respect to the region s with 20 mm width adjacent to the exposed region r in a reduction ratio of 7/50, then exposure was performed with respect to the region t with 20 mm width adjacent to the exposed region s in a reduction ratio of 6/50, thereby a whole region of 100 mm square was exposed. Subsequently, development was executed with 1.2 mass % aqueous solution of TMAH (tetramethyl ammonium hydroxide: $(CH_3)_4NOH$) for patterning the resist layer 71. Thereafter, heat at a temperature of 130° C. was applied for 10 minutes.

Next, by use of a reactive ion etching device (RIE-200iP manufactured by SAMCO Inc.), dry etching process was performed for patterning the $SiO_2$ layer. As an etching condition, trifluoromethane ($CHF_3$) was used as a reactant gas, and the reaction was executed for 16 minutes under conditions of a pressure of 0.3 Pa and output bias/ICP=60/100 (W).

Then, by removing the residue of the resist by the resist removing solution, patterning of the ITO film was performed by dry etching with the above reactive ion etching device. Here, as an etching condition, a mixed gas of Chlorine ($Cl_2$) and silicon tetrachloride ($SiCl_4$) was used as a reactant gas, and the reaction was executed for 7 minutes under conditions of a pressure of 1 Pa and output bias/ICP=180/100 (W).

Subsequently, the reactant gas was replaced with $CHF_3$ gas, and the reaction was executed for 20 minutes under conditions of a pressure of 0.3 Pa and output bias/ICP=120/100 (W) as an etching condition.

Next, the $SiO_2$ layer was cleaned by showering pure water thereto, then dried by use of a spin dry device.

As a result, the plural concave portions 16p with 2 μm diameter were formed in the region p with 20 mm width adjacent to the anode electrode terminal 15, the plural concave portions 16q with 1.8 μm diameter were formed in the region q with 20 mm width adjacent to the region p, the plural concave portions 16r with 1.6 μm diameter were formed in the region r with 20 mm width adjacent to the region q, the plural concave portions 16s with 1.4 μm diameter were formed in the region s with 20 mm width adjacent to the region r, and the plural concave portions 16t with 1.2 μm diameter were formed in the region t with 20 mm width adjacent to the region s, and the depth of the concave portions 16p to 16t was all 170 nm (among this, the $SiO_2$ layer was etched by 30 nm at the time of etching).

Figure 9:
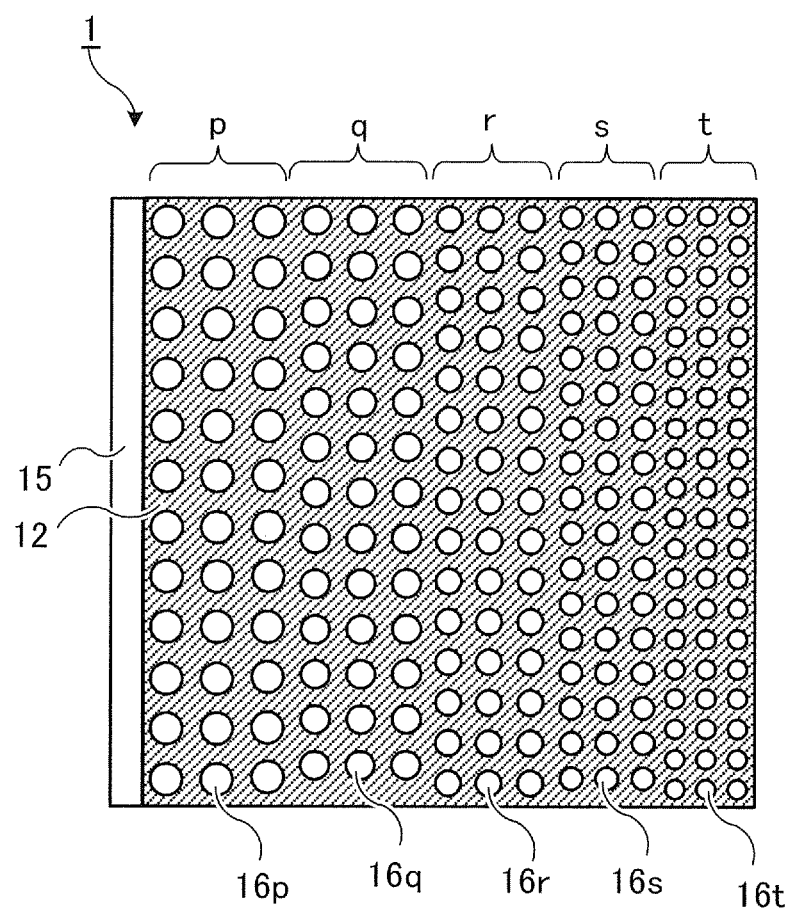
FIG. 9 is a diagram for illustrating a distribution pattern of the plural concave portions in the light-emitting device produced in the Example 1.

FIG. 9 is a diagram for illustrating a distribution pattern of the plural concave portions 16 in the light-emitting device 1 produced in the Example 1. As shown in FIG. 9, in the light-emitting device 1, the light-emitting region has five sub-regions (region p to region t), the plural concave portions 16p to 16t are formed on the anode layer 12 and the dielectric layer 13 (not shown in the figure) so that the diameter thereof becomes smaller gradually from the region p near the anode electrode terminal 15 to the region t far from the anode electrode terminal 15.

Values regarding the plural concave portions 16p to 16t in the regions p to t of the light-emitting device 1 are shown in Table 1.

TABLE 1

| | Region p | Region q | Region r | Region s | Region t |
|---|---|---|---|---|---|
| Distance from anode electrode terminal (mm) | 0~20 | 20~40 | 40~60 | 60~80 | 80~100 |
| Radius of one concave portion (mm) | $10 \times 10^{-4}$ | $9 \times 10^{-4}$ | $8 \times 10^{-4}$ | $7 \times 10^{-4}$ | $6 \times 10^{-4}$ |
| Occupation ratio of concave portions (%) | 20 | 20 | 20 | 20 | 20 |
| Edge density of concave portion (mm/mm$^2$) | 393 | 436 | 491 | 561 | 654 |

As shown in Table 1, in the light-emitting devise 1, the plural concave portions (the concave portions 16p to 16t) are formed so that the edge density of the concave portions (mm/mm$^2$) are increased gradually from the region p near the anode electrode terminal 15 to the region t far from the anode electrode terminal 15. On the other hand, the occupation ratio (%) of the concave portions is shown to be equal in each sub-region. Note that, the occupation ratio (%) of the concave portions in each region p to t is a proportion of the area of the concave portion with respect to the whole area of each region p to t.

Next, on the electrode substrate in which the above concave portions 16p to 16t were formed, the solution A was applied by the spin coating method (spin rate: 3000 rpm) and was left under a nitrogen atmosphere at the temperature of 140° C. for an hour to be dried, thereby the light-emitting portion 17 was formed. Thereafter, on the light-emitting portion 17, a sodium fluoride layer (thickness of 4 nm) as the cathode buffer layer and an aluminum layer (thickness of 130 nm, sheet resistance of 0.5Ω per square) as the cathode layer 14 were formed in order by a deposition method (not shown in the figure), thereby the light-emitting device 1 was produced.

When voltage was applied to the light-emitting device 1 produced as described above and light was emitted near the anode electrode terminal 15 with brightness of 100 cd/m$^2$, brightness was 100 cd/m$^2$ also at the region relatively far from the anode electrode terminal 15 and unevenness in brightness could not be visually recognized.

Example 2

In accordance with the following operation, a light-emitting device 2 having a similar cross-sectional shape with FIG. 3A was produced.

By the similar operation with Example 1, after forming a silicon dioxide ($SiO_2$) layer on a glass substrate with ITO, the silicon dioxide layer and ITO film were patterned and dried by a spin dry device.

Next, the glass substrate with ITO was mounted to a reactive ion etching device (RIE-200iP manufactured by SAMCO Inc.). Thereafter, AC voltage was applied to the oxygen gas introduced in the device to discharge an electrical current, and the generated oxygen plasma was irradiated to the glass substrate. Here, an amount of oxygen gas flowed into the device was adjusted, and the reaction was executed for 30 seconds under conditions of a pressure of 1 Pa and an applied electrical power of 150 W. Then, the gas to be introduced was replaced with the $CHF_3$ gas. Here, an amount of the flowed gas was adjusted, and the pressure was set to be 7 Pa. Further, the reaction was executed for 10 seconds under conditions of a PE mode and an applied electrical power of 300 W.

As a result, the plural concave portions 16 with 2 μm diameter were formed in a region p2 with 20 mm width adjacent to the anode electrode terminal 15, the plural concave portions 16 with 1.8 μm diameter were formed in a region q2 with 20 mm width adjacent to the region p2, the plural concave portions 16 with 1.6 μm diameter were formed in a region r2 with 20 mm width adjacent to the region q2, the plural concave portions 16 with 1.4 μm diameter were formed in a region s2 with 20 mm width adjacent to the region r2, and the plural concave portions 16 with 1.2 μm diameter were formed in a region t2 with 20 mm width adjacent to the region s2, and the depth of the concave portions 16 was 200 nm (among this, the depth of a bored part 162 was 30 nm, and the SiO$_2$ layer was etched by 30 nm at the time of etching). Note that the distribution of the plural concave portions 16 in the light-emitting device 2 (not shown in the figure) is same as that of the light-emitting device 1 produced in Example 1 (refer to FIG. 9).

Thereafter, by the same operation with that in Example 1, the light-emitting portion 17, the cathode buffer layer and the cathode layer 14 were formed in order (not shown in the figure), thereby the light-emitting device 2 was produced.

When voltage was applied to the light-emitting device 2 produced as described above and light was emitted near the anode electrode terminal 15 with brightness of 100 cd/m$^2$, brightness was 100 cd/m$^2$ also at the other side and unevenness in brightness could not be visually recognized.

Example 3

In accordance with the following operation, a light-emitting device 3 having a similar cross-sectional shape with FIG. 2 was produced.

After forming an anode electrode terminal 15 and a SiO$_2$ layer on the same glass substrate with ITO as used in Example 1, by use of the same mask A used in producing the light-emitting device 1, plural concave portions 16u with a circular shape were formed in a region u with 33 mm width from the anode electrode terminal 15 in a reduction ratio of 1/5 of the mask A by use of a stepper exposure device. Thereafter, in a region v with 33 mm width adjacent to this region u, plural concave portions 16v were formed with a mask B that is different from the mask A. The mask B has a quartz (having a thickness of 3 mm) as a substrate, and corresponds to a pattern in which depressed dodecagonal shape was arranged in a square lattice. In the depressed dodecagonal shape, the edge length is 1.25 times of that in the circular shape with the same width. By use of a stepper exposure device, the plural concave portions 16v with a depressed dodecagonal shape were formed in the region v in a reduction ratio of 1/5 of the mask B.

Subsequently, in a region w with 33 m width adjacent to the region v, the plural concave portions 16w was formed by use of a mask C that is different from the mask B. The mask C has a quartz (having a thickness of 3 mm) as a substrate, and corresponds to a pattern in which depressed dodecagonal shape was arranged in a square lattice. In the depressed dodecagonal shape, the edge length is 1.50 times of that in the circular shape with the same width. By use of a stepper exposure device, the plural concave portions 16w with a depressed dodecagonal shape were formed in the region w in a reduction ratio of 1/5 of the mask C.

Figure 10:
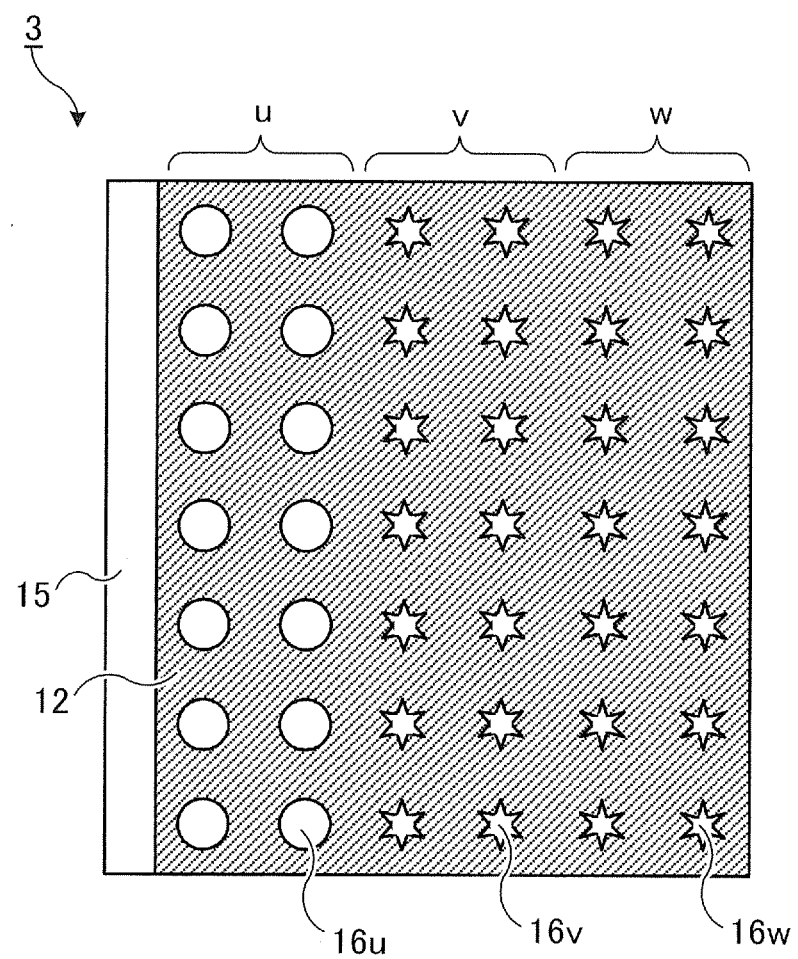
FIG. 10 is a diagram for illustrating a distribution pattern of the plural concave portions in the light-emitting device produced in the Example 3.

FIG. 10 is a diagram for illustrating a distribution pattern of the plural concave portions 16u to 16w in the light-emitting device 3 produced in the Example 3. In the light-emitting device 3, the light-emitting region has three sub-regions, that is, region u to region w from the side near to the anode electrode terminal 15. In each region u to w, the gap (pitch) between the plural concave portions 16u to 16w is twice of the diameter of the minimum circle surrounding the concave portions 16u to 16w respectively. In the present exemplary embodiment, the depth of the concave portions 16u to 16w is all 170 nm (the SiO$_2$ layer was etched by 30 nm at the time of etching), and the diameter of the circular shape is 2 μm. The minimum circumscribed circle of the depressed dodecagonal shape is all 2 μm, and the length of one side of the depressed dodecagonal shape formed by the mask B is 0.65 μm, and the length of one side of the depressed dodecagonal shape formed by the mask C is 0.78 μm.

Values regarding the plural concave portions 16u to 16w in the regions u to w of the light-emitting device 3 are shown in Table 2.

TABLE 2

| | Region u | Region v | Region w |
|---|---|---|---|
| Distance from anode electrode terminal (mm) | 0~33 | 33~66 | 66~99 |
| Perimeter of one concave portion (mm) | 6.3 × 10$^{-3}$ | 7.8 × 10$^{-3}$ | 9.4 × 10$^{-3}$ |
| Occupation ratio of concave portions (%) | 8.7 | 3.7 | 2.2 |
| Edge density of concave portion (mm/mm$^2$) | 175 | 218 | 261 |

As shown in Table 2, in the light-emitting devise 3, the plural concave portions (the concave portions 16u to 16w) are formed so that the edge density of the concave portions (mm/mm$^2$) are increased gradually from the region u near the anode electrode terminal 15 to the region w far from the anode electrode terminal 15. On the other hand, the occupation ratio (%) of the concave portions is gradually decreased.

Thereafter, by the same operation with that in Example 1, the light-emitting portion 17, the cathode buffer layer and the cathode layer 14 were formed in order (not shown in the figure), thereby the light-emitting device 3 was produced.

When voltage was applied to the light-emitting device 3 produced as described above and light was emitted near the anode electrode terminal 15 with brightness of 100 cd/m$^2$, brightness was 90 cd/m$^2$ near the opposite side and unevenness in brightness was visually in a small range. The maximum brightness was 105 cd/m$^2$, and the difference from the minimum brightness was 15 cd/m$^2$.

Comparative Example 1

By the same operation with that in Example 1, after forming the anode electrode terminal 15 and the SiO$_2$ layer on the glass substrate with ITO, a photoresist layer was formed on the SiO$_2$ layer. Next, by use of the same mask A as in Example 1, exposure was repeatedly performed to a region of 10 mm square in a reduction ratio of 1/5 of the mask A by a stepper exposure device, thereby whole of the light-emitting region was exposed. Thereafter, by the same operation with that in Example 1, the light-emitting portion 17, the cathode buffer layer and the cathode layer 14 were formed in order (not shown in the figure), thereby the light-emitting device 4 was produced.

Figure 11:
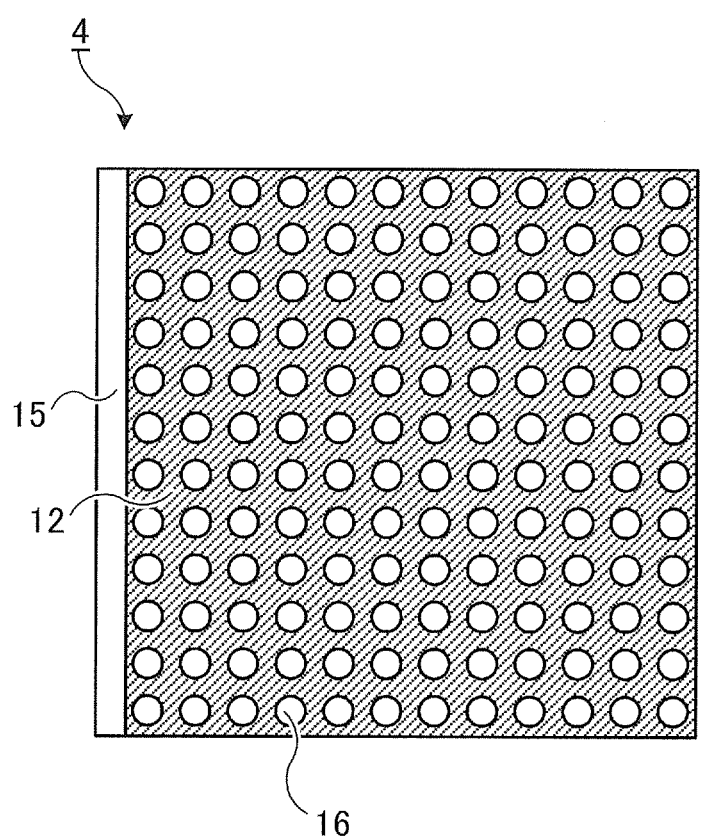
FIG. 11 is a diagram for illustrating a distribution pattern of the plural concave portions in the light-emitting device produced in the Comparative Example 1.

FIG. 11 is a diagram for illustrating a distribution state pattern of the plural concave portions 16 in the light-emitting device 4 produced in the Comparative Example 1. The concave portions 16 were all formed to have a diameter of 2 μm and depth of 170 nm (the SiO$_2$ layer was etched by 30 nm at the time of etching).

When voltage was applied to the light-emitting device 4 produced as described above and light was emitted near the anode electrode terminal 15 with brightness of 100 cd/m$^2$, brightness was 60 cd/m$^2$ near the opposite side and unevenness in brightness was visually recognized.

Comparative Example 2

Figure 12:
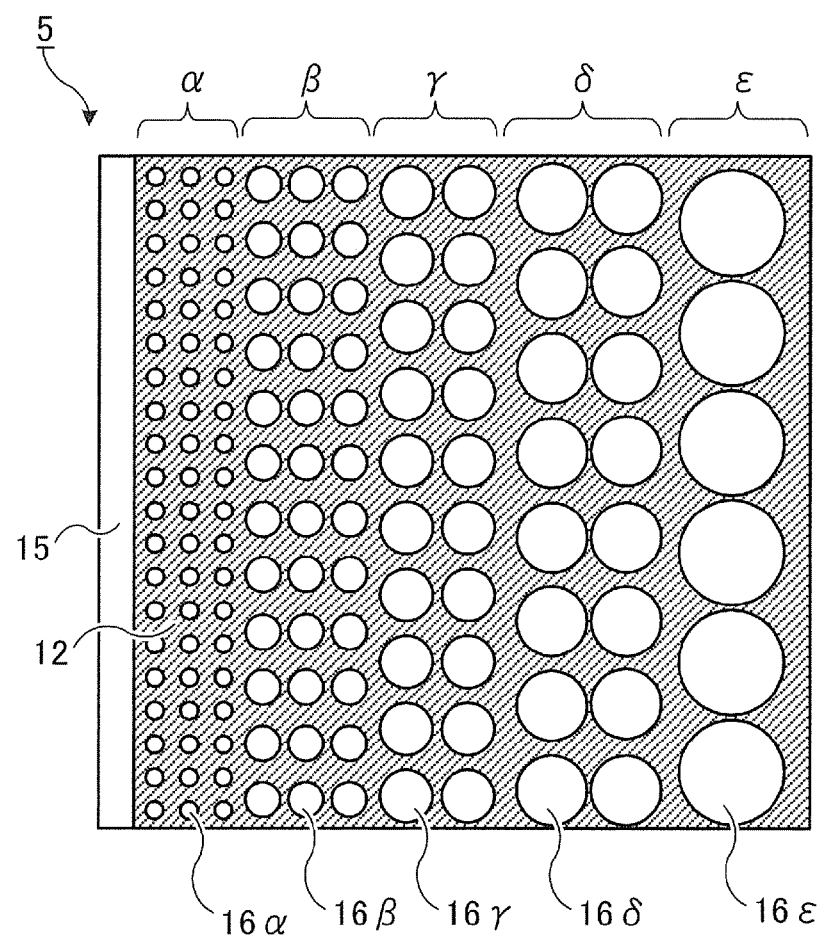
FIG. 12 is a diagram for illustrating a distribution pattern of the plural concave portions in the light-emitting device produced in the Comparative Example 2.

By the same operation with that in Example 1, a light-emitting device 5 having a similar cross-sectional shale as that of FIG. 2 and having a distribution pattern of the plural concave portions 16 shown in FIG. 12 was produced.

FIG. 12 is a diagram for illustrating a distribution pattern of the plural concave portions 16α to 16∈ in the light-emitting device 5 produced in the Comparative Example 2. In the light-emitting device 5, the light-emitting region has five sub-regions, that is, region α to region ∈ from the side near to the anode electrode terminal 15. In the light-emitting device 5, the circular concave portions 16 were formed to be a square lattice shape with respect to a region of 100 mm square by a stepper exposure device. Here, 10×10$^7$ of circular concave portions 16α with the radius of 1×10$^{-3}$ mm were formed in a region α with a distance of 20 mm from the anode electrode terminal 15, 28×10$^6$ of circular concave portions 16β with the radius of 2×10$^{-3}$ mm were formed in a region β with a distance of 20 mm to 40 mm, 78×10$^5$ of circular concave portions 16γ with the radius of 4×10$^{-3}$ mm were formed in a region γ with a distance of 40 mm to 60 mm, 22×10$^5$ of circular concave portions 16δ with the radius of 8×10$^{-3}$ mm were formed in a region δ with a distance of 60 mm to 80 mm, and 65×10$^4$ of circular concave portions 16∈ with the radius of 16×10$^{-3}$ mm were formed in a region ∈ with a distance of 80 mm to 100 mm. Note that, each region of region α to ∈ is set to be 2000 mm$^2$ (=20 mm×100 mm).

Note that, the concave portions 16α to 16∈ were all formed to have a depth of 170 nm (the SiO$_2$ layer was etched by 30 nm at the time of etching). Further, by the same operation with that in Example 1, the light-emitting portion 17, the cathode buffer layer and the cathode layer 14 were formed in order (not shown in the figure).

When voltage was applied to the light-emitting device 5 produced as described above and light was emitted near the anode electrode terminal 15 with brightness of 100 cd/m$^2$, brightness was 10 cd/m$^2$ near the opposite side and unevenness in brightness was visually recognized. Values regarding the plural concave portions 16α to 16∈ in the regions α to ∈ of the light-emitting device 5 are shown in Table 3.

TABLE 3

| | Region α | Region β | Region γ | Region δ | Region ∈ |
|---|---|---|---|---|---|
| Distance from anode electrode terminal (mm) | 0~20 | 20~40 | 40~60 | 60~80 | 80~100 |
| Radius of one concave portion (mm) | 1 × 10$^{-3}$ | 2 × 10$^{-3}$ | 4 × 10$^{-3}$ | 8 × 10$^{-3}$ | 16 × 10$^{-3}$ |
| Total number of concave portions | 1 × 10$^8$ | 28 × 10$^6$ | 78 × 10$^5$ | 22 × 10$^5$ | 65 × 10$^4$ |
| Occupation ratio of concave portions (%) | 15.7 | 17.3 | 19.6 | 22.5 | 26.2 |
| Edge density of concave portion (mm/mm$^2$) | 314 | 176 | 98 | 55 | 33 |

As shown in FIG. 12 and Table 3, in the light-emitting devise 5, the plural concave portions (the concave portions 16α to 16∈) are formed so that the occupation ratio of the concave portions (%) are increased gradually from the region α near the anode electrode terminal 15 to the region ∈ far from the anode electrode terminal 15. On the other hand, it is found that the edge density of the concave portions (mm/mm$^2$) is gradually decreased. Note that, occupation ratio of the concave portions (%) is a proportion of the area of the concave portions with respect to the whole area of each region (α to ∈). Therefore, it is found that the brightness distribution is the light-emitting surface becomes uneven and unevenness in brightness is caused.

REFERENCE SIGNS LIST 1, 3, 4, 5, 10, 20, 100a, 100b, 100c, 100d, 100e . . . Light-emitting device
10a, 10b, 10c, 10d, 10e . . . Cross-sectional shape
11, 21 . . . Substrate
12, 22 . . . Anode layer
13, 23 . . . Dielectric layer
14, 24 . . . Cathode layer
15 . . . Anode electrode terminal
16, 26 . . . Concave portion
17, 27 . . . Light-emitting portion
17a . . . Center portion
17b . . . Edge region
17c . . . Outer portion
25 . . . Cathode electrode terminal
30, 31 . . . Pattern
161 . . . Passing-through portion
162 . . . Bored portion

The invention claimed is:
1. A light-emitting device comprising:
a substrate;
a first electrode layer that is formed on the substrate;
a dielectric layer that is formed directly on the first electrode layer or formed on the first electrode layer with another layer interposed therebetween;
a second electrode layer that is formed directly on the dielectric layer or on the dielectric layer with another layer interposed therebetween; and
a light-emitting portion that contacts the first electrode layer and the second electrode layer; wherein,
a plurality of concave portions are formed to pass through the dielectric layer and at least one of the first electrode layer and the second electrode layer,
the light-emitting portion is formed to contact at least the first electrode layer and the dielectric layer in the concave portion, and
a light-emitting region is set to include the first electrode layer, the dielectric layer, the second electrode layer and the light-emitting portion and to include all the plurality of concave portions as seen from a direction perpendicular to the substrate plane, and
the light-emitting device further comprises a terminal that is formed outside of the light-emitting region and connects one of the first electrode layer and the second electrode layer having larger sheet resistance to a power supply; wherein,
in the light-emitting region, the plurality of concave portions are formed so that a sum, per unit area, of a contour length of planar shapes of the concave portions on an upper surface of the dielectric layer is increased from a region near the terminal to a region far from the terminal.

2. The light-emitting device according to claim 1, wherein, in the light-emitting region, all of the planar shapes of the plurality of concave portions at the upper surface of the dielectric layer are the same.

3. The light-emitting device according to claim 1, wherein, in the light-emitting region, the planar shapes of the plurality of concave portions at the upper surface of the dielectric layer are similar to each other.

4. The light-emitting device according to claim 1, wherein, in the light-emitting region, the planar shapes of the plurality of concave portions at the upper surface of the dielectric layer include at least two shapes that are not similar to each other.

5. The light-emitting device according to claim 1, wherein, in the light-emitting region, each area that is occupied with each planar shape of the plurality of concave portions at the upper surface of the dielectric layer is substantially the same in an arbitrary region in the light-emitting region.

6. The light-emitting device according to claim 1, wherein, the light-emitting region has a plurality of sub-regions divided in accordance with a distance from the terminal;
a distribution pattern of the concave portions formed in the sub-region nearest the terminal is regarded as a basic pattern;
a distribution pattern of the concave portions in another sub-region is a reduced pattern of the basic pattern; and
a reduction ratio of the reduced pattern of the another sub-region with respect to the basic pattern decreases as the another sub-region is far from the terminal.

7. The light-emitting device according to claim 1, wherein, in the light-emitting region, the maximum width of each of the concave portions at an upper surface of the dielectric layer is 10 μm or less.

8. The light-emitting device according to claim 1, wherein, in the light-emitting region, the concave portions are formed $10^2$ to $10^8$ per 1 mm square.

9. A method of manufacturing a light-emitting device comprising:
a first electrode layer forming process in which a first electrode layer and a dielectric layer are formed on a substrate in order;
a concave portion forming process in which by a photolithography which includes an exposure of a photoresist layer formed on the dielectric layer by use of a photomask of a predetermined pattern, a plurality of concave portions that pass through the first electrode layer and the dielectric layer are formed;
a light-emitting portion forming process in which a light-emitting portion is formed so as to fill at least a part of each of the concave portions and to cover surfaces of the first electrode layer and the dielectric layer that are exposed in each of the concave portions;
a second electrode layer forming process in which a second electrode layer is formed on the light-emitting portion;
a terminal forming process in which, of the first electrode layer and the second electrode layer, a terminal that connects the electrode layer having larger sheet resistance to a power supply is formed; wherein,
in the concave portion forming process, a surface of the photoresist layers is divided into a plurality of sub-regions in accordance with a distance from the terminal;
the photomask pattern corresponding to a distribution pattern of the concave portions that are formed nearest the terminal is regarded as a basic pattern;
the photomask pattern corresponding to a distribution pattern of the concave portions in another sub-region is a reduced pattern of the basic pattern; and
a reduction ratio of the reduced pattern of the another sub-region with respect to the basic pattern is decreased as the another sub-region is far from the terminal.

* * * * *